(12) United States Patent
Chang et al.

(10) Patent No.: US 7,287,118 B2
(45) Date of Patent: Oct. 23, 2007

(54) MAINTAINING AN AVERAGE ERASE COUNT IN A NON-VOLATILE STORAGE SYSTEM

(75) Inventors: Robert C. Chang, Danville, CA (US); Bahman Qawami, San Jose, CA (US); Farshid Sabet-Sharghi, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/362,666

(22) Filed: Feb. 25, 2006

(65) Prior Publication Data

US 2006/0149896 A1 Jul. 6, 2006

Related U.S. Application Data

(63) Continuation of application No. 10/281,823, filed on Oct. 28, 2002, now Pat. No. 7,035,967.

(51) Int. Cl.
*G06F 12/00* (2006.01)
(52) U.S. Cl. ........................ 711/103; 711/102; 711/154; 711/156; 365/185.02; 365/185.29; 365/185.33; 365/230.03
(58) Field of Classification Search ................ 365/200, 365/230, 185.33, 185.02, 185.29, 230.03; 711/103, 154, 156, 102, 165
See application file for complete search history.

(56) References Cited

U.S. PATENT DOCUMENTS

| | | | |
|---|---|---|---|
| 5,222,109 A | 6/1993 | Pricer | |
| 5,297,148 A | 3/1994 | Harari et al. | |
| 5,388,083 A | 2/1995 | Assar et al. | |
| 5,406,529 A * | 4/1995 | Asano | 365/230.03 |
| 5,438,573 A | 8/1995 | Mangan et al. | |
| 5,568,423 A * | 10/1996 | Jou et al. | 365/185.33 |
| 5,568,439 A | 10/1996 | Harari | |

(Continued)

FOREIGN PATENT DOCUMENTS

EP 0589597 A2 3/1994

(Continued)

OTHER PUBLICATIONS

Kim, "A Space-Efficient Flash Translation Layer for Compactflash Systems", Trans. Consumer Elec., vol. 48, No. 2 (IEEE, May 2002).

(Continued)

*Primary Examiner*—Stephen C. Elmore
*Assistant Examiner*—Daniel Kim
(74) *Attorney, Agent, or Firm*—Anderson, Levine & Lintel

(57) ABSTRACT

Methods and apparatus for maintaining an average erase count in a system memory of a non-volatile memory system are disclosed. According to one aspect of the present invention, a method for determining an average number of times each block of a number of blocks within a non-volatile memory of a memory system has been erased includes obtaining an erase count for each block that indicates a number of times each block has been erased. Once all the erase counts have been obtained, the erase counts are summed, and an average erase count that indicates the average number of times each block of the number of blocks has been erased is created by substantially dividing the sum by the number of blocks.

9 Claims, 15 Drawing Sheets

U.S. PATENT DOCUMENTS

| | | | |
|---|---|---|---|
| 5,598,370 | A | 1/1997 | Niijima et al. |
| 5,737,742 | A | 4/1998 | Achiwa et al. |
| 5,835,935 | A | 11/1998 | Estakhri et al. |
| 5,845,313 | A | 12/1998 | Estakhri et al. |
| 5,860,082 | A | 1/1999 | Smith et al. |
| 5,907,856 | A | 5/1999 | Estakhri et al. |
| 5,924,113 | A | 7/1999 | Estakhri et al. |
| 5,930,193 | A | 7/1999 | Achiwa et al. |
| 5,954,828 | A | 9/1999 | Lin |
| 5,956,473 | A | 9/1999 | Ma et al. |
| 5,963,473 | A | 10/1999 | Norman |
| 6,009,496 | A * | 12/1999 | Tsai .................. 711/103 |
| 6,016,275 | A | 1/2000 | Han |
| 6,081,447 | A | 6/2000 | Lofgren et al. |
| 6,115,785 | A | 9/2000 | Estakhri et al. |
| 6,125,435 | A | 9/2000 | Estakhri et al. |
| 6,226,759 | B1 | 5/2001 | Miller et al. |
| 6,230,233 | B1 * | 5/2001 | Lofgren et al. ......... 711/103 |
| 6,260,156 | B1 | 7/2001 | Garvin et al. |
| 6,282,605 | B1 | 8/2001 | Moore |
| 6,381,176 | B1 | 4/2002 | Kim et al. |
| 6,426,893 | B1 | 7/2002 | Conley et al. |
| 6,523,132 | B1 | 2/2003 | Harai et al. |
| 6,604,168 | B2 | 8/2003 | Ogawa |
| 6,683,817 | B2 | 1/2004 | Wei et al. |
| 6,694,402 | B1 | 2/2004 | Muller |
| 6,732,221 | B2 | 5/2004 | Ban |
| 6,741,486 | B2 * | 5/2004 | Sakui ..................... 365/51 |
| 2001/0054129 | A1 * | 12/2001 | Wouters ............... 711/103 |

FOREIGN PATENT DOCUMENTS

| | | |
|---|---|---|
| JP | 62-283496 | 12/1987 |
| JP | 62-283497 | 12/1987 |
| WO | WO 00/14641 | 3/2000 |

OTHER PUBLICATIONS

Chiang et al., "Managing Flash Memory In Personal Communication Devices", Int'l Symp. Consumer Elec. (IEEE, 1997), pp. 177-182.

Chang et al., "An Adaptive Striping Architecture for Flash Memory Storage Systems of Embedded Systems", 8th Real-Time and Embedded Tech. and Appl. Symp. (IEEE, Sep. 24, 2002).

* cited by examiner

MAINTAINING AN AVERAGE ERASE COUNT IN A NON-VOLATILE STORAGE SYSTEM

CROSS REFERENCE TO RELATED APPLICATIONS

This application is a continuation of application Ser. No. 10/281,823, filed Oct. 28, 2002, now U.S. Pat. No. 7,035,967.

The present invention is related to co-pending U.S. patent application Ser. No. 10/281,739 entitled "WEAR-LEVELING IN NON-VOLATILE STORAGE SYSTEMS," filed Nov. 28, 2002, co-pending U.S. patent application Ser. No. 10/281,670 entitled "TRACKING THE MOST FREQUENTLY ERASED BLOCKS IN NON-VOLATILE MEMORY SYSTEMS", filed Nov. 28, 2002, co-pending U.S. patent application Ser. No. 10/281,824 entitled "TRACKING THE LEAST FREQUENTLY ERASED BLOCKS IN NON-VOLATILE MEMORY SYSTEMS", filed Nov. 28, 2002, co-pending U.S. patent application Ser. No. 10/281,631 entitled "METHOD AND APPARATUS FOR SPLITTING A LOGICAL BLOCK", filed Nov. 28, 2002, co-pending U.S. patent application Ser. No. 10/281,855 entitled "METHOD AND APPARATUS FOR GROUPING PAGES WITHIN A BLOCK," filed Nov. 28, 2002, co-pending U.S. patent application Ser. No. 10/281,762 entitled "METHOD AND APPARATUS FOR RESOLVING PHYSICAL BLOCKS ASSOCIATED WITH A COMMON LOGICAL BLOCK," filed Nov. 28, 2002, co-pending U.S. patent application Ser. No. 10/281,696 entitled "MAINTAINING ERASE COUNTS IN NON-VOLATILE STORAGE SYSTEMS," filed Nov. 28, 2002, co-pending U.S. patent application Ser. No. 10/281,626 entitled "METHOD AND APPARATUS FOR MANAGING AN ERASE COUNT BLOCK," filed Nov. 28, 2002, and co-pending U.S. patent application Ser. No. 10/281,804 entitled "METHOD AND APPARATUS FOR PERFORMING MULTI-PAGE READ AND WRITE OPERATIONS IN A NON-VOLATILE MEMORY SYSTEM," filed Nov. 28, 2002, which are each incorporated herein by reference in their entireties.

BACKGROUND OF THE INVENTION

1. Field of Invention

The present invention relates generally to mass digital data storage systems. More particularly, the present invention relates to systems and methods for efficiently enabling erase counts, which are used to allow the wear associated with storage areas in a non-volatile storage system to be spread out across substantially all storage areas, to be maintained.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

In general, flash memory storage systems may include flash memory cards and flash memory chip sets. Flash memory chip sets generally include flash memory components and a controller components. Typically, a flash memory chip set may be arranged to be assembled into an embedded system. The manufacturers of such assemblies or host systems typically acquire flash memory in component-form, as well as other components, then assemble the flash memory and the other components into a host system.

Although non-volatile memory or, more specifically, flash memory storage blocks within flash memory systems may be repetitively programmed and erased, each block or physical location may only be erased a certain number of times before the block wears out, i.e., before memory begins to become smaller. That is, each block has a program and erase cycle limit. In some memory, a block may be erased up to approximately ten thousand times before the block is considered to be unusable. In other memory, a block may be erased up to approximately one hundred thousand times or even up to a million times before the block is considered to be worn out. When a block is worn out, thereby causing a loss of use or a significant degradation of performance to a portion of the overall storage volume of the flash memory system, a user of the flash memory system may be adversely affected, as for the example through the loss of stored data or the inability to store data.

The wear on blocks, or physical locations, within a flash memory system varies depending upon how much each of the blocks is programmed. If a block or, more generally, a storage element, is programmed once, then effectively never reprogrammed, the number of program and erase cycles and, hence, wear associated with that block will generally be relatively low. However, if a block is repetitively written to and erased, e.g., cycled, the wear associated with that block will generally be relatively high. As logical block addresses (LBAs) are used by hosts, e.g., systems which access or use a flash memory system, to access data stored in a flash memory system, if a host repeatedly uses the same LBAs to write and overwrite data, the same physical locations or blocks within the flash memory system are repeatedly written to and erased, as will be appreciated by those of skill in the art.

When some blocks are effectively worn out while other blocks are relatively unworn, the existence of the worn out blocks generally compromises the overall performance of the flash memory system. In addition to degradation of performance associated with worn out blocks themselves, the overall performance of the flash memory system may be compromised when an insufficient number of blocks which are not worn out are available to store desired data. Often, a flash memory system may be deemed unusable when a critical number worn out blocks are present in the flash memory system, even when many other cells in the flash memory system are relatively unworn. When a flash memory system which includes a substantial number of relatively unworn blocks is considered to be unusable, many resources associated with the flash memory system are effectively wasted.

In order to increase the likelihood that blocks within a flash memory system are worn fairly evenly, wear leveling operations are often performed. Wear leveling operations, as will be understood by those skilled in the art, are generally arranged to allow the physical locations or blocks which are associated with particular LBAs to be changed such that the same LBAs are not always associated with the same physical locations or blocks. By changing the block associations of LBAs, it is less likely that a particular block may wear out well before other blocks wear out.

One conventional wear leveling process involves swapping physical locations to which two relatively large portions of customer or host LBAs are mapped. That is, the LBAs associated with relatively large sections of storage cells are swapped. Such swapping is initiated through a manual command from a customer, e.g., through the use of a host and, as a result, is not transparent to the customer. Also, swapping operations that involve moving data between two relatively large sections of storage cells are time consuming and, hence, inefficient. Additionally, the performance of the overall flash memory system may be adversely affected by swapping operations of a relatively long duration which consume significant resources associated with the overall flash memory system. As will be appreciated by those skilled in the art, moving data from a first location typically involves copying the data into another location and erasing the data from the first location.

Another conventional wear leveling process involves allowing blocks to wear. Once the blocks have effectively worn out, the sectors assigned to the blocks may be reassigned by mapping the addresses associated with the sectors to spare areas once the blocks in which the sectors have been stored have worn out, or have become unusable. As the number of spare areas or blocks is limited and valuable, there may not always be spare areas to which sectors associated with unusable blocks may be mapped. In addition, effectively remapping sectors only after blocks have become unusable generally allows performance of the overall flash memory system to degrade.

Therefore, what are desired are a method and an apparatus for efficiently and substantially transparently performing wear leveling within a flash memory storage system. That is, what is needed is a system which facilitates a wear leveling process which promotes more even wear in physical locations associated with the flash memory storage system without requiring a significant use of computational resources.

SUMMARY OF THE INVENTION

The present invention relates to a system and a method for maintaining an average erase count in a system memory of a non-volatile memory system. According to one aspect of the present invention, a method for determining an average number of times each block of a number of blocks within a non-volatile memory of a memory system has been erased includes obtaining an erase count for each block that indicates a number of times each block has been erased. Once all the erase counts have been obtained, the erase counts are summed, and an average erase count that indicates the average number of times each block of the number of blocks has been erased is created by substantially dividing the sum by the number of blocks.

In one embodiment, the erase counts are obtained from the blocks. In such an embodiment, the erase counts may be obtained from redundant or overhead areas of the blocks. In another embodiment, the erase counts are obtained from an erase count block in the memory system that contains the erase counts for each block of the number of blocks.

By maintaining an average erase count, a characterization of a number of times an average block within an overall memory system has been erased may be readily obtained. When a block is erased, there may be no indication of how many times that block has been erased. As a result, the amount of wear associated with the block may not be readily determined or estimated. Using an average erase count to indicate how many times such a block is likely to have been erased allows a reasonable estimate of the wear of the block to be determined. As such, wear leveling may occur more efficiently.

According to another aspect of the present invention, a data structure includes a first indicator that provides an indication of a number of times each usable block of the plurality of blocks has been erased, and a second indicator that indicates a total number of blocks included in the plurality of blocks. In one embodiment, the data structure also includes a header that contains the first indicator and the second indicator.

According to yet another aspect of the present invention, a method for substantially preparing an erased block for use includes obtaining the erased block, obtaining an indicator that characterizes a number of times each block of a plurality of blocks has been erased, and storing the indicator that characterizes a number of times each block of the plurality of blocks has been erased in the erased block as an indication of a number of times the erased block has been erased. In one embodiment, the method also includes determining when an indicator of a number of times the erased block has been erased is available, and storing the indicator of the number of times the erased block has been erased in the erased block when it is determined that the indicator of the number of times the erased block has been erased is available. In such an embodiment, obtaining the indicator that characterizes a number of times each block in the plurality of blocks has been erased includes obtaining the indicator that characterizes the number of times each block in the plurality of blocks has been erased substantially only when it is determined that the indicator of the number of times the erased block has been erased is not available, and storing the indicator that characterizes the number of times each block in the plurality of blocks has been erased includes storing the indicator that characterizes the number of times each block in the plurality of blocks has been erased substantially only when it is determined that the indicator of the number of times the erased block has been erased is not available.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Non-volatile memory storage blocks within flash memory storage systems may be repetitively programmed and erased, although each block may generally only be erased a finite number of times before the block wears out. When a block wears out, a relatively significant degradation of performance associated with the portion of the overall storage volume of the flash memory storage system that includes the worn out block occurs, and data stored in that portion may be lost, or it may become impossible to store data in that portion.

In order to increase the likelihood that blocks wear out more evenly within a flash memory storage system, blocks may be more evenly utilized. By keeping track of how many times each block has been erased, as for example through the utilization of an erase count, memory within a system may be more evenly used. An erase count management technique may store an erase count which keeps track of how many times a particular block has been erased in a redundant area associated with the block. Tables may be built in system memory which substantially enables blocks that are in use to effectively be separated from blocks which have relatively high erase counts and blocks which have relatively low erase counts. When a block in use is erased, the block may be "added" to either a table of blocks which have relatively high erase counts or a table of blocks which have relatively low erase counts, as appropriate. Likewise, blocks may be "moved" from either the table of blocks which have relatively high erase counts or the table of blocks which have relatively low erase counts into a block mapping table, i.e., a set of tables of blocks which are in use, to substantially replace any block which has been reassigned from the block mapping table.

By categorizing blocks, blocks may be more evenly utilized as the use of each block may be more effectively managed to even out the wear associated with the blocks. Further, categorizing blocks into tables enables blocks with a low erase count and blocks with a high erase count to be readily identified and, hence, does not utilize a significant amount of computational resources. Hence, wear leveling occurs relatively efficiently. As a result, the life of the flash memory system may be extended substantially without significantly affecting the performance of the flash memory system.

In order to facilitate the categorizing of blocks, an erase count block may be allocated within a flash memory system. Such a block may be arranged to contain the erase counts of substantially all blocks which may be used to store data within the flash memory system. When a block is erased, the erase count of the block is typically erased. By storing the erase counts of substantially all blocks which have an associated erase count in the erase count block, the erase count of an erased block may be readily obtained, e.g., by reading the erase count from the erase count block.

Figure 1A:
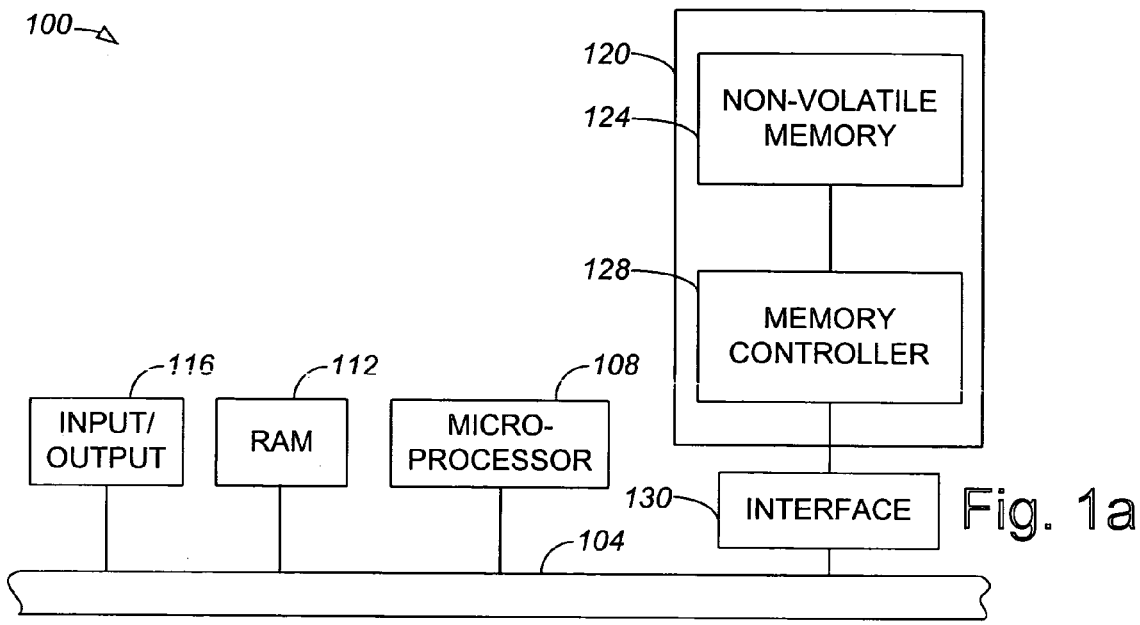
FIG. 1a is a diagrammatic representation of a general host system which includes a non-volatile memory device in accordance with an embodiment of the present invention.

Flash memory systems or, more generally, non-volatile memory devices generally include flash memory cards and chip sets. Typically, flash memory systems are used in conjunction with a host system such that the host system may write data to or read data from the flash memory systems. However, some flash memory systems include embedded flash memory and software which executes on a host to substantially act as a controller for the embedded flash memory. Referring initially to FIG. 1a, a general host system which includes a non-volatile memory device, e.g., a CompactFlash memory card or an embedded system, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, or a video player. It should be appreciated, however, that host system 100 may generally be substantially any system which stores data or information, and retrieves data or information.

It should be appreciated that host system 100 may also be a system which either only captures data, or only retrieves data. That is, host system 100 may be a dedicated system which stores data, or host system 100 may be a dedicated system which reads data. By way of example, host system 100 may be a memory writer which is arranged only to write or store data. Alternatively, host system 100 may be a device such as an MP3 player which is typically arranged to read or retrieve data, and not to capture data.

A non-volatile memory device 120 which, in one embodiment, is a removable non-volatile memory device, is arranged to interface with bus 104 to store information. An optional interface block 130 may allow non-volatile memory device 120 to interface indirectly with bus 104. When present, input/output circuit block 130 serves to reduce loading on bus 104, as will be understood by those skilled in the art. Non-volatile memory device 120 includes non-volatile memory 124 and an optional memory control system 128. In one embodiment, non-volatile memory device 120 may be implemented on a single chip or a die. Alternatively, non-volatile memory device 120 may be implemented on a multi-chip module, or on multiple discrete components which may form a chip set and may be used together as non-volatile memory device 120. One embodiment of non-volatile memory device 120 will be described below in more detail with respect to FIG. 1b.

Non-volatile memory 124, e.g., flash memory such as NAND flash memory, is arranged to store data such that data may be accessed and read as needed. Data stored in non-volatile memory 124 may also be erased as appropriate, although it should be understood that some data in non-volatile memory 124 may not be erasable. The processes of storing data, reading data, and erasing data are generally controlled by memory control system 128 or, when memory control system 128 is not present, by software executed by microprocessor 108. The operation of non-volatile memory 124 may be managed such that the lifetime of non-volatile memory 124 is substantially maximized by essentially causing sections of non-volatile memory 124 to be worn out substantially equally.

Non-volatile memory device 120 has generally been described as including an optional memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and Secure Digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art. Alternatively, the functionality of memory control system 128 may be provided by microprocessor 108, as for example in an embodiment in which non-volatile memory device 120 does not include memory controller 128, as discussed above.

Figure 1B:
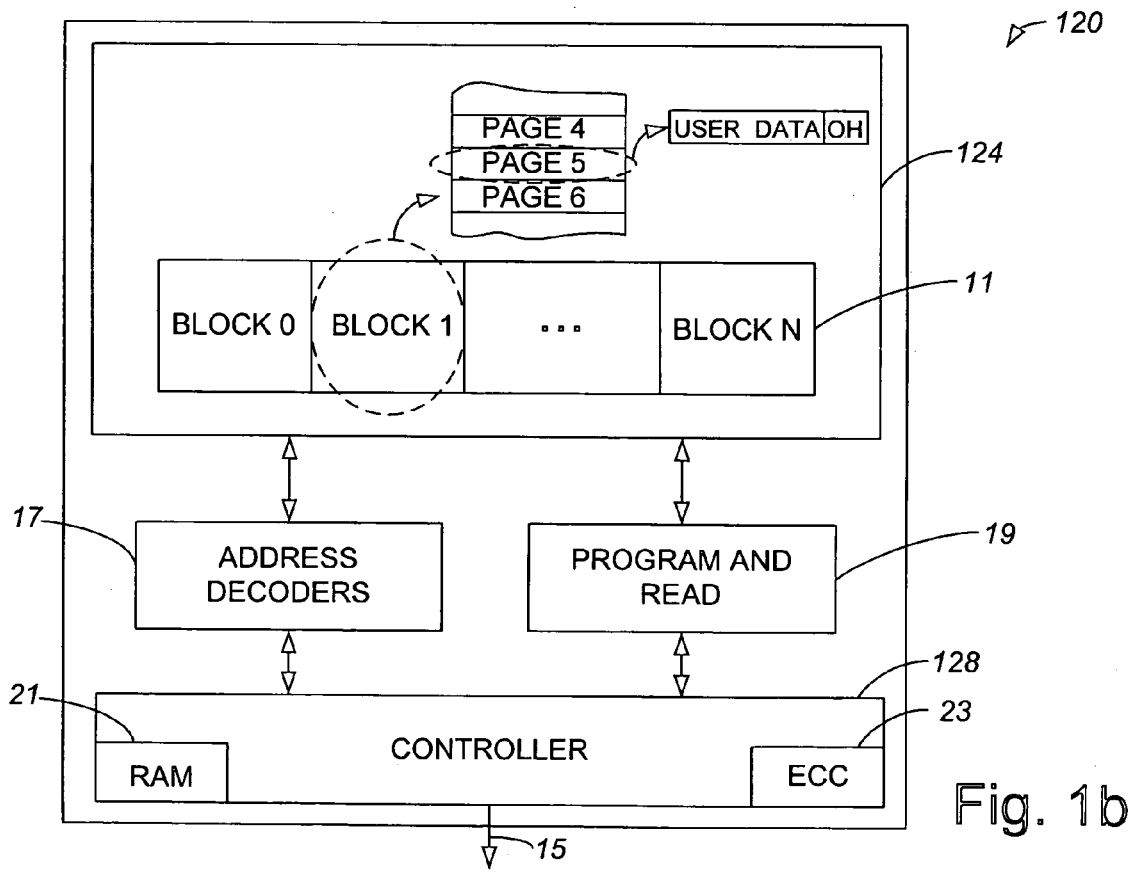
FIG. 1b is a diagrammatic representation a memory device, e.g., memory device 120 of FIG. 1a, in accordance with an embodiment of the present invention.

With reference to FIG. 1b, non-volatile memory device 120 will be described in more detail in accordance with an embodiment of the present invention. As described above, non-volatile memory device 120 includes non-volatile memory 124 and may include memory control system 128. Memory 124 and control system 128, or controller, may be components of non-volatile memory device 120, although when memory 124 is an embedded NAND device, as will be discussed below with reference to FIG. 1c, non-volatile memory device 120 may not include control system 128. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

When present, control system 128 communicates over a bus 15 to a host computer or other system that is using the memory system to store data. Bus 15 is generally a part of bus 104 of FIG. 1a. Control system 128 also controls operation of memory 124, which may include a memory cell array 11, to write data provided by the host, read data requested by the host and perform various housekeeping functions in operating memory 124. Control system 128 generally includes a general purpose microprocessor which has associated non-volatile software memory, various logic circuits, and the like. One or more state machines are often also included for controlling the performance of specific routines.

Memory cell array 11 is typically addressed by control system 128 or microprocessor 108 through address decoders 17. Decoders 17 may apply the correct voltages to gate and bit lines of array 11 in order to program data to, read data from, or erase a group of memory cells being addressed by the control system 128. Additional circuits 19 may include programming drivers that control voltages applied to elements of the array that depend upon the data being programmed into an addressed group of cells. Circuits 19 may also include sense amplifiers and other circuits necessary to read data from an addressed group of memory cells. Data to be programmed into array 11, or data recently read from array 11, may be stored in a buffer memory 21 that may either be external to control system 128 or within control system 128, as shown. Control system 128 may also usually contain various registers for temporarily storing command and status data, and the like.

Figure 2:
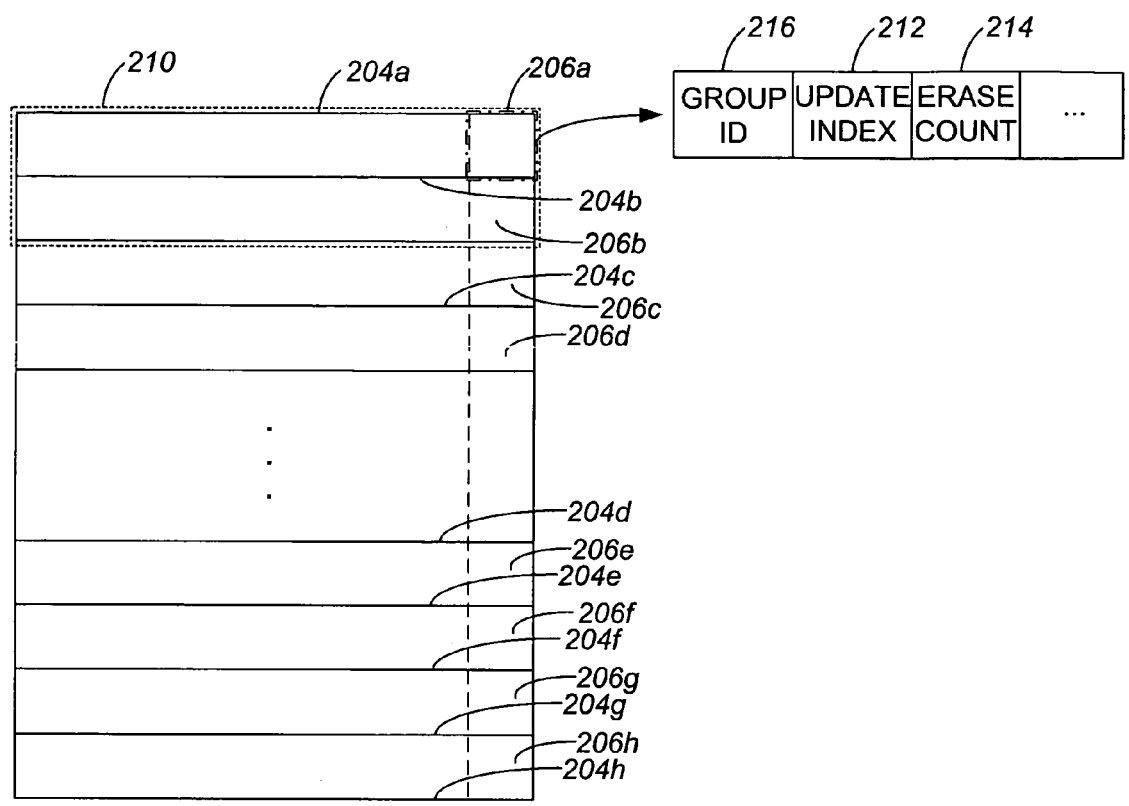
FIG. 2 is a diagrammatic representation of a portion of a flash memory in accordance with an embodiment of the present invention.

Array 11 is divided into a large number of BLOCKS 0-N memory cells. As is common for flash EEPROM systems, the block may be the smallest unit of erase. That is, each block may contain the minimum number of memory cells that are erased together. Each block is typically divided into a number of pages, as also illustrated in FIG. 2. A page may be the smallest unit of programming. That is, a basic programming operation may write data into or read data from a minimum of one page of memory cells One or more sectors of data are typically stored within each page. As shown in FIG. 1b, one sector includes user data and overhead data. Overhead data typically includes an error correction code (ECC) that has been calculated from the user data of the sector. A portion 23 of the control system 128 may calculate the ECC when data is being programmed into array 11, and may also check the ECC when data is being read from array 11. Alternatively, the ECCs may be stored in different pages, or different blocks, than the user data to which they pertain.

A sector of user data is typically 512 bytes, corresponding to the size of a sector in magnetic disk drives. Overhead data is typically an additional 16 bytes, although it should be appreciated that the number of bytes included in overhead data may vary. One sector of data is most commonly included in each page, but two or more sectors may instead form a page. Any number of pages may generally form a block. By way of example, a block may be formed from eight pages up to 512, 1024 or more pages. The number of blocks is chosen to provide a desired data storage capacity for the memory system. Array 11 may be divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

Figure 1C:
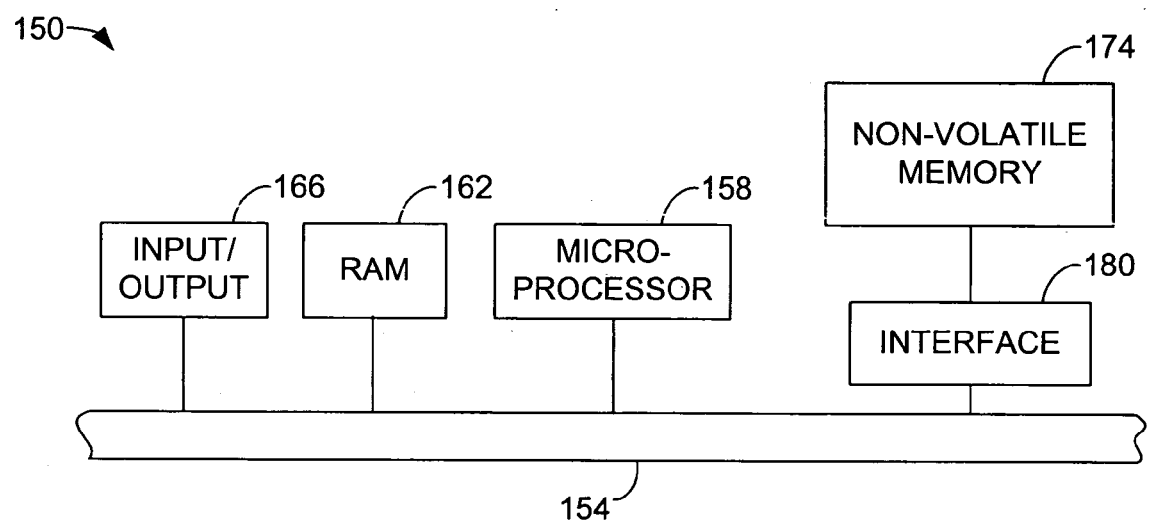
FIG. 1c is a diagrammatic representation of a host system which includes an embedded non-volatile memory.

In one embodiment, non-volatile memory such as a NAND flash memory is embedded into a system, e.g., a host system. FIG. 1c is a diagrammatic representation of a host system which includes an embedded non-volatile memory. A host or computer system 150 generally includes a system bus 154 which allows a microprocessor 158, a RAM 162, and input/output circuits 166, among other components (not shown) of host system 150, to communicate. A non-volatile memory 174, e.g. a flash memory, allows information to be stored within host system 150. An interface 180 may be provided between non-volatile memory 174 and bus 154 to enable information to be read from and written to non-volatile memory 174.

Non-volatile memory 174 may be managed by microprocessor 158 which effectively executes either or both software and firmware which is arranged to control non-volatile memory 174. That is, microprocessor 158 may run code devices, i.e., software code devices or firmware code devices, which allow non-volatile memory 174 to be controlled. Such code devices, which will be described below, may enable physical blocks in non-volatile memory 174 to be addressed, and may enable information to be stored into, read from, and erased from the physical blocks.

When a particular section, e.g., storage element, of non-volatile memory 124 of FIG. 1a is programmed continuously, e.g., written to and erased repeatedly, that particular area generally wears out more quickly than an area which is not programmed continuously. In order to effectively "even out" the wear of different areas within non-volatile memory 124, wear leveling may be substantially automatically performed such that areas which are programmed continuously are programmed less, while areas that are not programmed continuously may be programmed more.

Generally, to perform wear leveling, a block, e.g., a set of sectors which are associated with a physical location, which is programmed repeatedly may be swapped with a block which is associated with a physical location which is not programmed repeatedly. That is, a physical block which has been programmed and, hence, erased repeatedly may be swapped with a physical block which has been programmed and erased less often.

In one embodiment of the present invention, in order for it to be readily determined whether a particular physical block has been programmed and erased repeatedly, an erase count may be stored with the block. That is, a counter which keeps track of how many times a block has been erased may be maintained and incremented each time the block is erased. Such an erase count may be used to facilitate a determination of whether a particular block should be swapped with another block which has been erased less often. FIG. 2 is a diagrammatic representation of a portion of a flash memory in accordance with an embodiment of the present invention. Flash memory 200 may be divided into pages 204. Each page 204, which generally contains approximately 512 bytes of user data, effectively includes a redundant area 206, e.g., page 204a includes redundant area 206a. Each redundant area 206 or overhead area may include up to approximately sixteen bytes of information which typically includes, but is not limited to, a group identifier 216, an update index 212, and an erase count 214.

Typically, any number of pages 204 are included in a block 210. For ease of illustration, pages 204a, 204b are shown as being included in block 210, although it should be appreciated that the number of pages 204 included in block 210 may vary widely. In the described embodiment, block 210 may be arranged to include approximately 64 pages. For example, when flash memory 200 includes approximately 512 Megabits (Mb), flash memory 200 may effectively be divided into approximately 2048 blocks of 64 pages each.

As previously mentioned, erase count 214 may be incremented each time user data is erased from an associated block. For instance, erase count 214, which is associated with block 210, may be incremented each time data is erased from block 210. Since each page 204a, 204b included in block 210 generally has an erase count 214, the erase count 214 associated with each page 204a, 204b may be incremented when block 210 is erased.

In general, when a block containing data is erased, both the data areas and the redundant areas of the block are erased or emptied. The erased block is typically added to a spare block pool, which contains the erased blocks with smaller erase counts than those of other erased blocks, e.g., erased blocks of other tables. The spare block table may essentially be the least frequently erased block table, which will be described below. In one embodiment of the present invention, an erased block which has large erase count is added to the pool containing the erased blocks containing larger erase count comparing to erased blocks of other tables. The pool which contains erased blocks with large erase counts may be a most frequently erased block table, which will also be described below. The erase count of a just erased block is incremented by one and is saved in either the least frequently erased block table or the most frequently erased block table depending on the value of the count.

Figure 3:
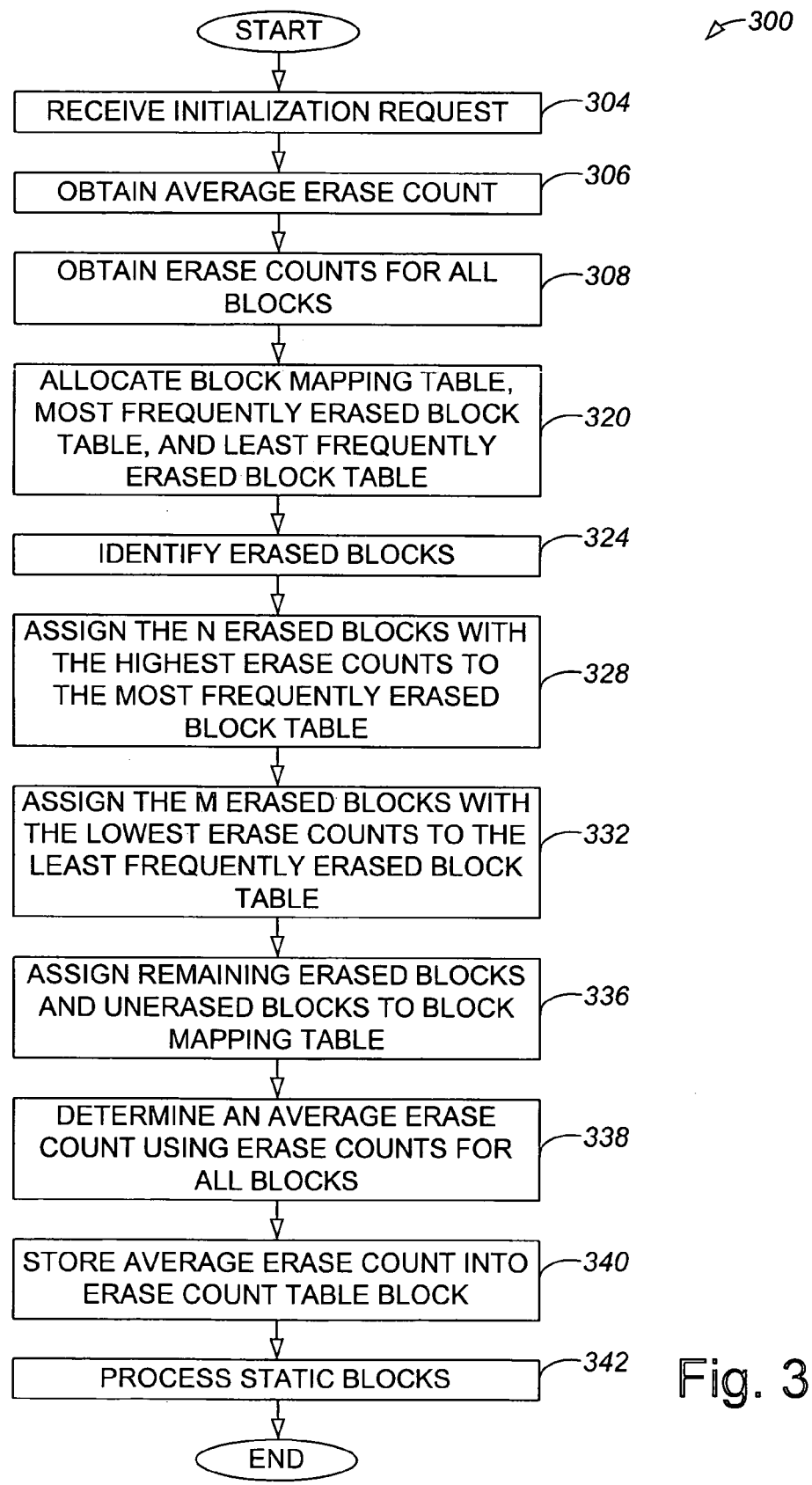
FIG. 3 is a process flow diagram which illustrates the steps associated with processing an initialization request with respect to a flash memory system, in accordance with an embodiment of the present invention.

Returning to FIG. 2, an erase count such as erase count 214 may be accessed during an initialization request. An initialization request may be made, for example, when a system, e.g., a system which includes embedded flash memory, is powered up, when spare blocks within a system are running low, when a user makes a request to balance block allocation, and when a user makes a request for block usage to occur more evenly. FIG. 3 is a process flow diagram which illustrates the steps associated with processing an initialization request with respect to a flash memory system, in accordance with an embodiment of the present invention. In general, an initialization request may either be initiated by a user or substantially automatically initiated by a controller associated with flash memory system, e.g., periodically or when a triggering condition is met. A process 300 of responding to an initialization request begins at step 304 in which an initialization request is effectively received. An initialization request may be received by a controller or a processor which is in communication with flash memory which is to be initialized. Such a request may be provided by a user via a host at power up, or when block allocation is to be balanced, for example.

Once the initialization request is received, an average erase count is obtained in step 306. In one embodiment, the average erase count is stored in an erase count block which is written into NAND memory associated with the system, although it should be appreciated that the average erase count may be stored or written into substantially any data structure in NAND memory associated with the structure. The erase count block (ECB) containing the average erase count and the erase count of each block is stored in a block of the flash memory. It should be appreciated that when an erase count block is created, e.g., when the system is initially formatted, the average erase count and the erase count of each block in the table is typically initialized to a value of zero. An erase count block will be described in below with respect to FIG. 8a. After the average erase count is obtained, erase counts for substantially all blocks within the system are obtained. As described above with respect to FIG. 2, the erase count for a particular block containing data may be stored in a redundant area that is associated with that block. Hence, obtaining the erase count for substantially all blocks containing data may include accessing a redundant area associated with each block, and storing each erase count into the erase count block.

At an initialization request, the erase count of an erased block is obtained from an erase count block. The erase count block generally retains its value because the redundant area of that block is erased. When the overall system is shut down, a termination request is typically made so the erase count table is updated to contain the latest erase count of substantially all blocks. At any given time, a block belongs in a most frequently erased block table, a least frequently erased block table, an erase count block, or in a block mapping table. The erase count of a block that belongs to an erase count block is stored in a redundant area of the block. The erase count of a block that contains data often belongs to a block mapping table and is stored in the redundant area. The erase count of an erased block that belongs to a block mapping table has a zero erase count because the block has effectively never been used. Obtaining erase counts from blocks in a least frequently erased block table or a most frequently erased block table involves getting the value from the table since each entry of the tables generally contains both the block number of an erased block and its erase count. Upon the completion of the processing of an initialization request, the erase count block is generally updated with the current erase count of all blocks.

In step 320, a block mapping table is allocated in the system memory, e.g., the host system memory. As will be appreciated by those skilled in the art, a block mapping table may be arranged to provide a mapping between a logical block address (LBA) and a physical block address (PBA). Additionally, a most frequently erased block table and a least frequently erased block table are also allocated in step 320.

A most frequently erased block table is typically sized or otherwise configured to effectively hold information relating to erased blocks which have been erased most frequently. That is, a most frequently erased block is arranged to hold information, e.g., erase counts and mapping information, pertaining to erased blocks with the highest erase counts in the system. Similarly, a least frequently erased block table is generally sized or otherwise configured to accommodate information pertaining to erased blocks with the lowest erase counts. Although the size of the most frequently erased block table and the size of the least frequently erased block table may vary widely, the sizes are dependent upon the number of blocks which are to be designated as most frequently erased and the number of blocks which are to be designated as least frequently erased. Typically, the most frequently erased block table is generally sized to accommodate information for fewer erased blocks than the least frequently erased block table. By way of example, the most frequently erased block table may be sized to accommodate information for approximately eighteen erased blocks, while the least frequently erased block table may be sized to accommodate information relating to approximately seventy erased blocks. Alternatively, the most frequently erased block table may be sized to accommodate information for approximately ten erased blocks, while the least frequently erased block table may be sized to accommodate information for approximately fifty erased blocks.

After tables are allocated in step 320, erased blocks are identified in step 324. Then, in step 328, "N" erased blocks may be assigned to the most frequently erased blocks and essentially be assigned to the most frequently erased table. In one embodiment, the "N" erased blocks may be the "N" erased blocks with the highest erase counts as determined by a comparison of all erase counts. Alternatively, the "N" erased blocks to store in the most frequently erased block table may be determined based upon a comparison against the average erase count obtained in step 306. For instance, the "N" erased blocks may be "N" erased blocks which have an erase count that is at least a given percentage, e.g., approximately twenty-five percent, higher than the average erase count.

Once the most frequently erased block table is effectively populated, "M" erased blocks may be identified and effectively be assigned to the least frequently erased block table in step 332. The "M" erased blocks may generally be the "M" erased blocks with the lowest erase counts of all erased blocks associated with the system, or the "M" erased blocks may be "M" erased blocks which have an erase count that is at least a given percentage lower than the average erase count. The "M" erased blocks are effectively spare blocks which will be assigned to the block mapping table as appropriate.

Remaining erased blocks, i.e., erased blocks which have not been assigned to either the least frequently erased block table or the most frequently erased block table, are assigned to the block mapping table along with "unerased" blocks in step 336. In other words, remaining erased blocks as well as blocks containing data other than in associated redundant areas are associated with the block mapping table.

After the block mapping table, the least frequently erased block table, and the most frequently erased block table are effectively populated, e.g., with erase counts and mapping information pertaining to corresponding blocks, an average erase count may be determined in step 338. Determining the average erase count typically involves summing the erase counts of individual blocks which were obtained in step 308, and dividing the sum by the total number of blocks. While the average erase count may be determined in response to an initialization request, it should be appreciated that the average erase count may be updated or otherwise determined at substantially any time. The steps associated with one method of calculating an average erase count will be described below with respect to FIG. 13.

The average erase count calculated in step 338 is stored into the erase count block associated with the system. As previously mentioned, the average erase count is stored in an erase count block which is written into NAND memory associated with the system. Upon storing the average erase count into the erase count block, static blocks, or blocks which contain data and have a relatively low associated erase count, may be processed in step 342. The steps associated with one method of processing a static block will be described below with respect to FIG. 4. Once the static blocks are processed, the process of processing an initialization request is completed.

Within a group of blocks associated with a flash memory, there are usually blocks which are erased and blocks which contain data, i.e., user data, at any given time. Some of the blocks which contain data may be considered to be "normal" blocks, while others may be considered to be static blocks. Static blocks are blocks that contain data which is rarely changed. In other words, static blocks are rarely erased. Typically, static blocks may be associated with relatively old documents stored in flash memory, an executable program stored in the flash memory, or an operating system stored in the flash memory. A static block may generally have an erase count that is substantially lower than the erase count of the majority of blocks within flash memory. In one embodiment, a block which contains data may be considered to be a static block if the erase count of the block is below a certain percentage, e.g., approximately twenty percent, of the average erase count associated with a flash memory system.

Figure 4:
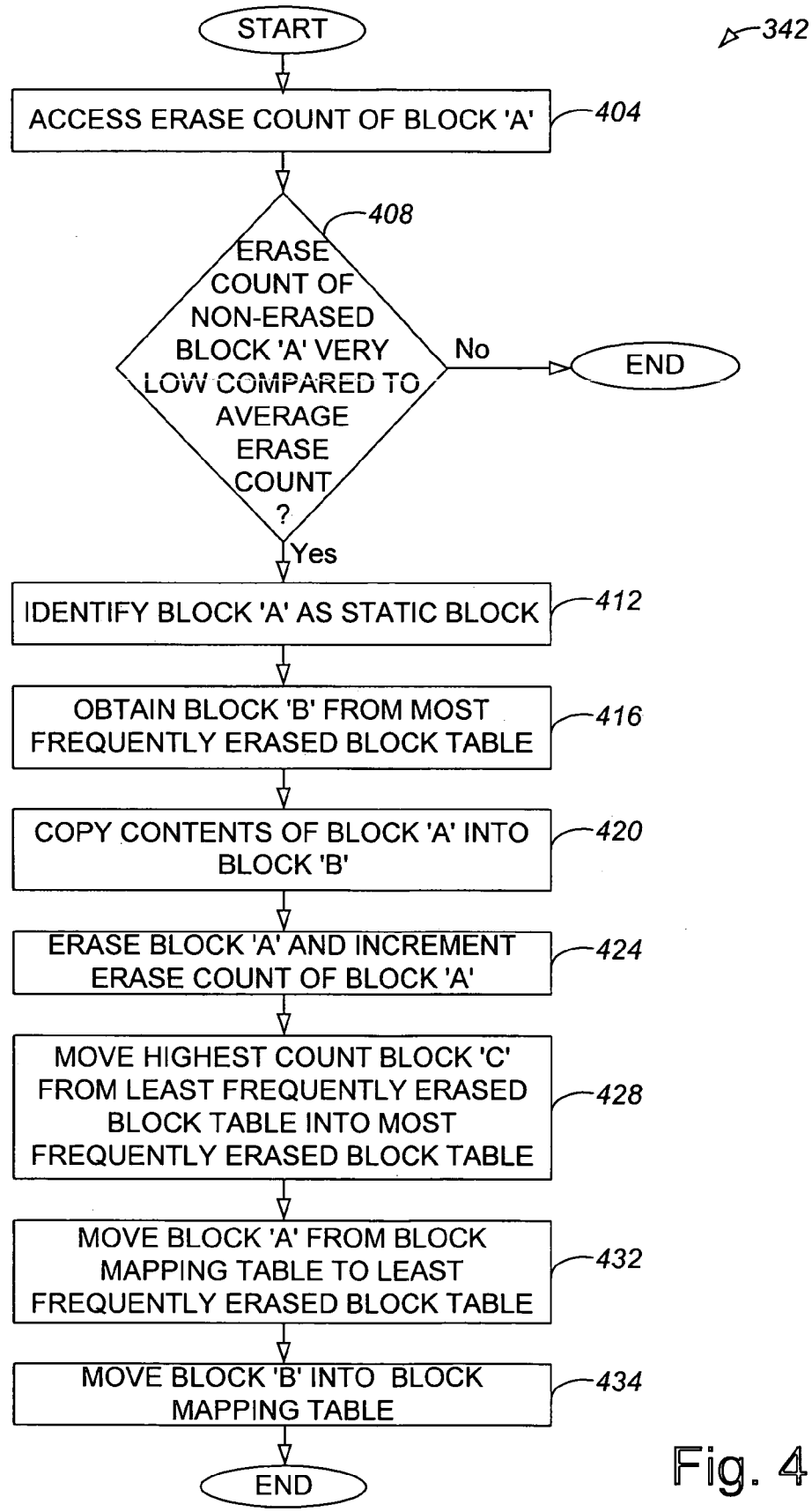
FIG. 4 is a process flow diagram which illustrates the steps associated with one method of processing a static block in accordance with an embodiment of the present invention.

Since a static block contains data that is rarely changed, the data contained in the static block may be copied into a block which has a relatively high erase count. That is, when the contents of a particular physical block are relatively static and, hence, are generally not changed, the contents may effectively be reassigned to a different physical block which has a relatively high erase count in order to enable the original physical block, which has a relatively low erase count, to be used to store contents which are changed more frequently. With reference to FIG. 4, the steps associated with processing a static block, i.e., step 342 of FIG. 3, will be described in accordance with an embodiment of the present invention. A process 342 of processing a static block of a system begins at step 404 in which the erase count of a non-erased block, e.g., block "A," is accessed. Once the erase count of block "A" is accessed, a determination is made in step 408 regarding whether the erase count of a non-erased block "A" is very low compared to the average erase count associated with the system.

Although a determination of whether the erase count of a non-erased block "A" is low compared to the average erase count may be based on substantially any suitable criteria, in one embodiment, the determination is made based on whether the erase count of block "A" has a value that is less than a value associated with a fraction of the average erase count. For example, the erase count of block "A" may be considered to be low when the erase count is less than a predetermined percentage of the average erase count.

If it is determined in step 408 that the erase count of block "A" is not very low compared to the average erase count, then the indication is that block "A" is most likely not a static block. It should be appreciated that while block "A" may still be a static block even if the erase count of block "A" is not considered to be very low, the erase count of block "A" in such a case would effectively not trigger a swap of block "A" with another block. Accordingly, the process of processing a static block is completed.

Alternatively, if it is determined in step 408 that the erase count of block "A" is very low compared to the average erase count, then the implication is that the contents of block "A" may be written into a block with a relatively high erase count such that block "A" with its low erase count may be free to store data that is changed relatively frequently. In other words, the indication when the erase count of block "A" is very low compared to the average erase count is that block "A" is a static block. As such, process flow moves from step 408 to step 412 in which block "A" is identified as a static block. Once block "A" is identified as a static block, a block, namely block "B," may be obtained from a group of most frequently erased blocks as identified by the most frequently erased block table in step 416.

After block "B" is obtained, the contents of block "A" are copied into block "B" in step 420. That is, the user data contained in block "A" is copied into block "B" in step 420. Once the contents of block "A" are copied into block "B," block "A" is erased in step 424. Typically, when block "A" is erased, the erase count associated with block "A" is incremented. A block, e.g., block "C," may be moved from the group of least frequently erased blocks into the group of most frequently erased blocks in step 428 such that the association of block "C" is effectively changed to the most frequently erased block table from the least frequently erased block table. In other words, block "C" is disassociated from the least frequently erased block table and associated with the most frequently erased block table. Such a move allows a space in the least frequently erased block table to effectively be opened up to accommodate block "A," which has a low erase count and, hence, is one of the least frequently erased blocks in the system. Typically, block "C" is the block with the highest erase count in the least frequently erased block table.

Upon moving block "C" out of the group of least frequently erased blocks, or otherwise disassociating block "C" from the least frequently erased block table, process flow moves from step 428 to step 432 in which block "A" is effectively moved from the block mapping table into the least frequently erased block table in step 432. Then, in step 434, block "B," which includes contents that were previously contained in block "A," is associated with the block mapping table. As will be appreciated by those skilled in the art, "moving" block "B" into the block mapping table typically includes updating the mapping of a logical block address that was associated with block "A" to now be associated with block "B." When information pertaining to block "C" is present in the most frequently erased block table, information pertaining to block "B" is present in the block mapping table, and information pertaining to block "A" is present in the least frequently erased block table, the process of processing a static block is completed. It should be understood that process 342 may be repeated until substantially all static blocks associated with a system have been identified and processed.

In general, a block mapping table, a least frequently erased block table, and a most frequently erased block table may be created in system memory, e.g., RAM 112 of FIG. 1a, when an initialization request is sent to an overall flash memory system. To build the tables, space may first be allocated in system memory to accommodate the tables.

Figure 5A:
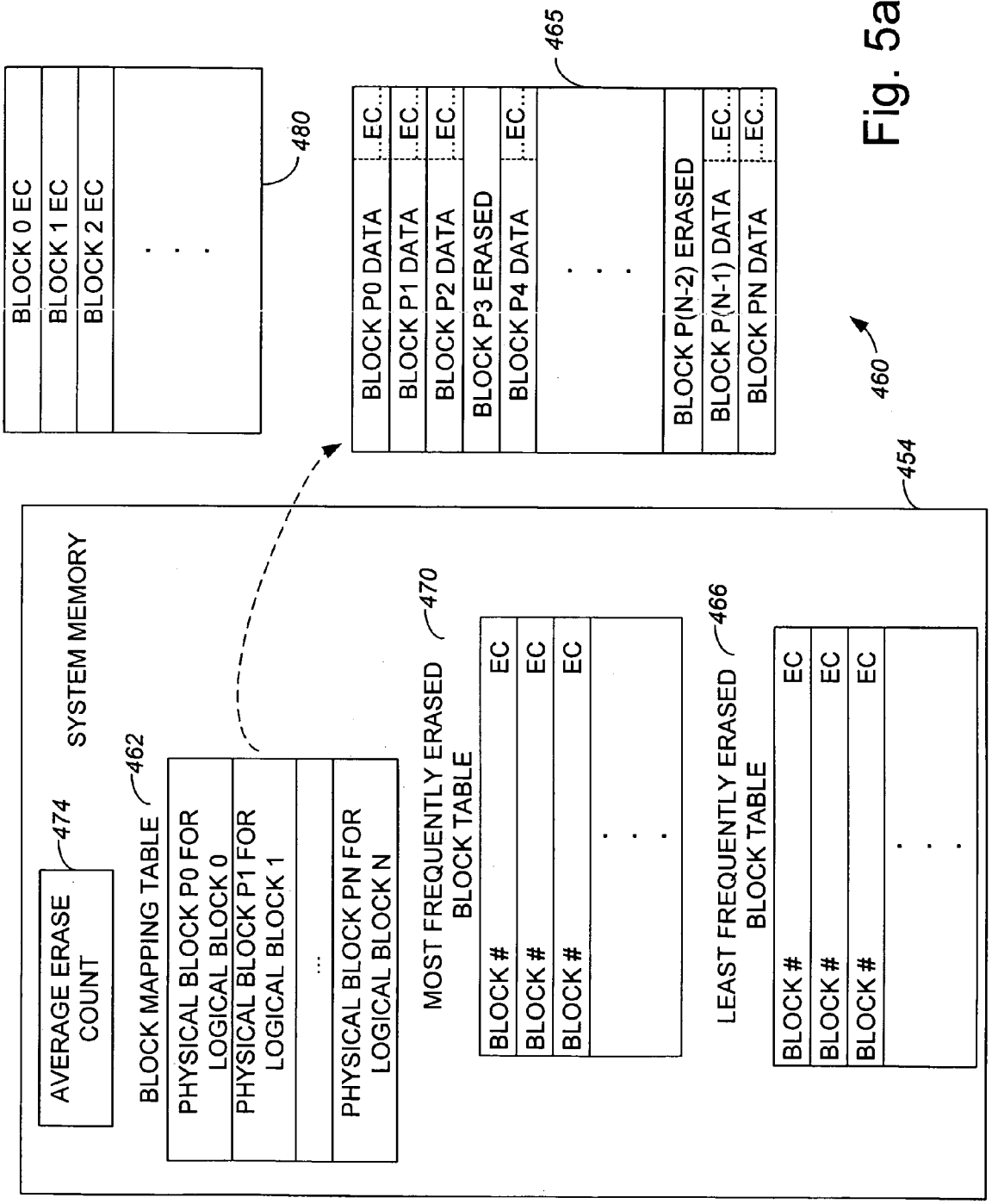
FIG. 5a is a diagrammatic block diagram representation of a system memory in accordance with an embodiment of the present invention.

As mentioned above, a block mapping table, a least frequently erased block table, and a most frequently erased block table are created in system memory, as is an average erase count. An average erase count and the erase count of each block are also written to an erase count block. FIG. 5a is a diagrammatic block diagram representation of a system memory in accordance with an embodiment of the present invention. A system memory 454 and a flash memory 460 are included in an overall system, and may, for example, effectively be components of a memory card or components of a host device in which flash memory 460 such as NAND memory is embedded. System memory 454 is arranged to store a block mapping table 462 with which blocks may be associated. Typically, block mapping table 462 may be used in order to associate LBAs with physical blocks associated with flash memory 460.

System memory 454 also holds a least frequently erased block table 466 and a most frequently erased block table 470 which, like block mapping table 462, are generally formed in response to an initialization request. An average erase count 474, which is arranged to hold the average erase count of blocks within flash memory 460, is created when an overall flash memory system is formatted. In one embodiment, an erase count block 480 is arranged to contain the erase counts of substantially all blocks 465 within flash memory 460. Each time an initialization request is made, an updated average erase count may be calculated, and stored into erase count block 480.

Figure 5B:
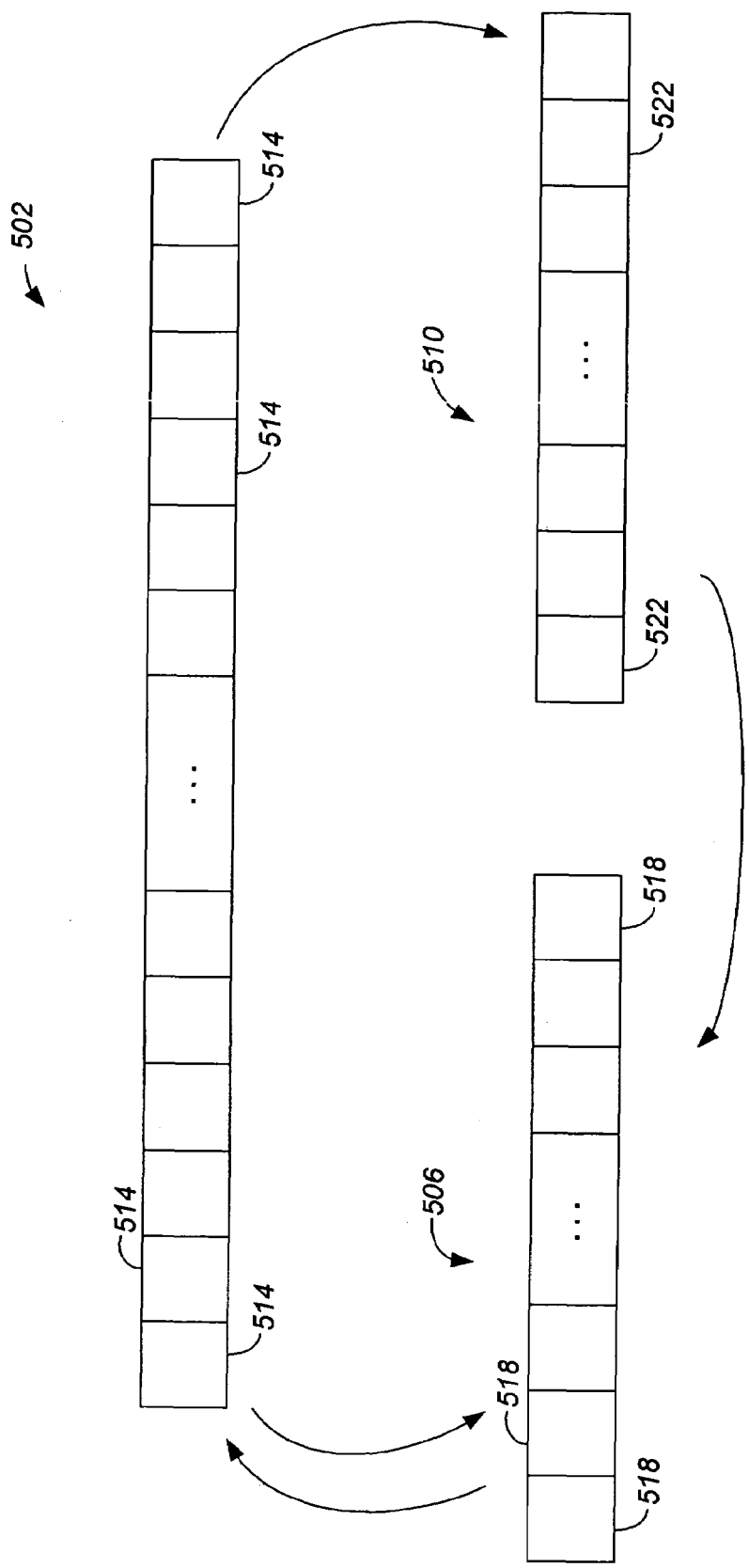
FIG. 5b is a diagrammatic representation of normal blocks, least frequently erased blocks, and most frequently erased blocks in accordance with an embodiment of the present invention.

FIG. 5b is a diagrammatic representation of a group of "normal" blocks, a group of least frequently erased blocks, and a group of most frequently erased blocks in accordance with an embodiment of the present invention. A group of blocks 502 includes blocks 514 which may be normal or static blocks which generally contain user data, or which may be erased may be erased but may not be either a most frequently erased block or a least frequently erased block. A group least frequently erased blocks 506 generally includes blocks 518 which have the lowest erase counts of the erased blocks within an overall system, while a group of most frequently erased blocks 510 generally includes blocks 522 which have the highest erase counts of the erased blocks within the overall system. In general, blocks 518 are effectively used as spare blocks.

When a block 514 is erased, it may be determined whether erased block 514 has a relatively low associated erase count or a relatively high associated erase count. When erased block 514 has a relatively low associated erase count, erased block 514 may be added to group of least frequently erased blocks 506. On the other hand, when erased block 514 has a relatively high associated erase count, erased block 514 may be reassigned to group of most frequently erased blocks 510.

Group of least frequently erased blocks 506, which may be of substantially any size, may be a sorted group. That is, blocks 518 may be substantially sorted based on erase counts. The sorting is typically reflected in a corresponding least frequently erased block table (not shown) which contains entries associated with blocks 518. For instance, each time a new block 518 is moved into or added to, or otherwise associated with, group of least frequently erased blocks 506, blocks 518 may essentially be sorted based on erase counts such that the least frequently erased block 518 in group of least frequently erased blocks 506 may be the next block 518 to be reassigned, as for example to group 502. In other words, when a new block into which data is to be copied is needed, the least erased block 518 of blocks 518 is identified using a least frequently erased block table, and taken from group of least frequently erased blocks 506. Typically, when a block 514 which contains data that is not needed is erased, that block 514 may be stored into group of least frequently erased blocks 506, and the least frequently erased block table may be updated accordingly, i.e., an entry which corresponds to the added block may be included in the least frequently erased block table.

Blocks 522 in group of most frequently erased blocks 510, like blocks 518 stored in group of least frequently erased blocks 506, may also be substantially sorted based on erase counts. The sorting is typically implemented by sorting entries in a most frequently erased block table (not shown) which serves to identify blocks 522. In one embodiment, an average erase count associated with blocks 522 may be calculated, i.e., an average erase count for group of most frequently erased blocks 510 may be determined. When a block 514 from group 502 is erased, and the erase count of the erased block 514 is found to exceed the average erase count for group of most frequently erased blocks 510 by more than a given percentage, e.g., more than approximately twenty percent, the erased block 514 may be added to group of most frequently erased blocks 510. When a new block 522 is effectively added to group of most frequently erased blocks 510, a block 522 within group of frequently erased blocks 510 that has the lowest erase count may be reassigned into group 502. Such reassignments are typically reflected by updating an associated block mapping table, least frequently erased block table, and most frequently erased block table (not shown).

Figure 6:
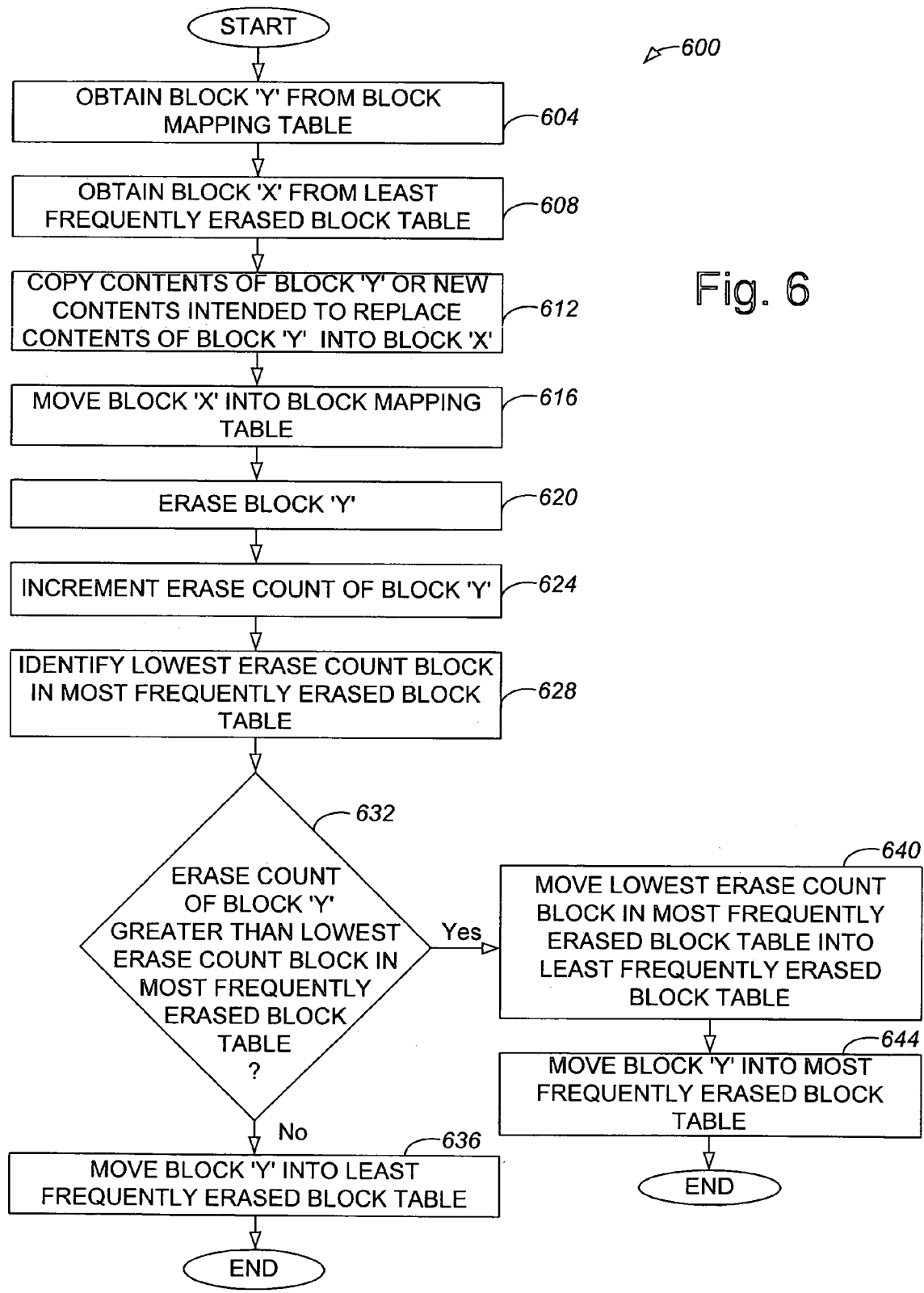
FIG. 6 is a diagrammatic representation of one method of performing a block swap/update in the system memory an overall memory system to allow for more even wear of the blocks in accordance with an embodiment of the present invention.

The swapping or updating of blocks between group 502, group of least frequently erased blocks 506, and most frequently erased blocks 510 may generally occur when a block 514 included in group 502 is to be erased or updated. Alternatively, the swapping or updating of blocks may occur substantially any time it is desired for a spare block to be allocated for use in group 502. Referring next to FIG. 6, one method of performing a block swap or update in an overall memory system such as a host system with embedded flash memory to allow for more even wear of the blocks will be described in accordance with an embodiment of the present invention. A process 600 of performing a block swap or update begins at step 604 in which a block, e.g., block "Y," is "obtained" from a block mapping table or otherwise identified using the block mapping table. The block that is obtained is the block that is to be effectively swapped out of the block mapping table for copying or updating its contents.

Once block "Y" is obtained, a block, e.g., block "X," is effectively obtained in step 608 from the least frequently erased block table. That is, a spare block is obtained from the group of least frequently erased blocks using the least frequently erased block table to identify an appropriate spare block. In general, block "X" is the block with the lowest erase count in the group of least frequently erased blocks, although it should be appreciated that block "X" may be substantially any block associated with the group of least frequently erased blocks and, hence, the least frequently erased block table. The data contents stored in block "Y," or new contents which are to replace the original contents of block "Y," are copied into block "X" in step 612.

After the contents of block "Y" are copied into block "X," block "X" is effectively moved into, or associated with, the block mapping table in step 616. In other words, mappings associated with block "Y" and block "X" are effectively updated such that an LBA which was previously mapped to block "Y" is remapped to block "X." When block "X" is effectively moved into the block mapping table, block "Y" is erased in step 620. Specifically, the data contents, e.g., user contents, stored in block "Y" may be erased using substantially any suitable technique. The erase count associated with block "Y," which is stored in a redundant area associated with block "Y," is then incremented in step 624 to indicate that block "Y" has once again been erased. It should be appreciated that in one embodiment, an erase count for "Y" which is effectively stored in an erase count block may be updated.

In step 628, the block with the lowest erase count in the most frequently erased block table is identified. As described above, in one embodiment, blocks referenced in the most frequently erased block table are sorted according to their respective erase counts. Sorting the blocks may include positioning the references to the blocks within the most frequently erased block table according to the erase counts of the blocks. Hence, identifying the block with the lowest erase count generally involves accessing the block reference in the position within the most frequently erased block table that is arranged to accommodate the block reference with the lowest erase count.

Once the block with the lowest erase count referenced in the most frequently erased block table is identified, process flow moves from step 628 to step 632 in which it is determined if the erase count of block "Y" is greater than the erase count of the block with the lowest erase count referenced in the most frequently erased block table. If it is determined that the erase count of block "Y" is not greater than the erase count of the block with the lowest erase count referenced in the most frequently erased block table, then the indication is that block "Y" is not considered to be frequently erased. Accordingly, process flow proceeds from step 632 to step 636 in which block "Y" is moved into the group of least frequently erased blocks and effectively moved into the least frequently erased block table, i.e., an entry corresponding to block "Y" is added into the least frequently erased block table. It should be appreciated that, in one embodiment, moving block "Y" into the group of least frequently erased blocks may include resorting substantially all block references in the least frequently erased block table using the erase count of each block. After block "Y" is effectively moved into the least frequently erased block table, the process of swapping or updating blocks is completed.

Returning to step 632, if the determination is step 632 is that the erase count of block "Y" exceeds the lowest erase count associated with the most frequently erased block table, the indication is that block "Y" should be moved into the group of most frequently erased blocks and effectively into the most frequently erased block table. In order for there to be room for block "Y" to be referenced in the most frequently erased block table, a block, e.g., the block with the lowest erase count referenced in the most frequently erased block table, effectively needs to be removed from the most frequently erased block table. As such, in step 640, the block with the lowest erase count referenced in the most frequently erased block table is moved into the group of least frequently erased blocks, and effectively moved into the least frequently erased block table. Moving the block into the group of least frequently erased blocks may include resorting the block references in the least frequently erased block table according to the erase count of each block.

After the block with the lowest erase count in the most frequently erased block table is effectively moved out of the most frequently erased block table, block "Y" is effectively moved into the most frequently erased block table in step 644. In one embodiment, moving block "Y" into the group of most frequently erased blocks and, hence, effectively into the most frequently erased block table, may include resorting the most frequently erase blocks according to the erase count of each block, including block "Y." When block "Y" is effectively moved into the most frequently erased block table, the process of swapping or updating blocks is completed.

Figure 7:
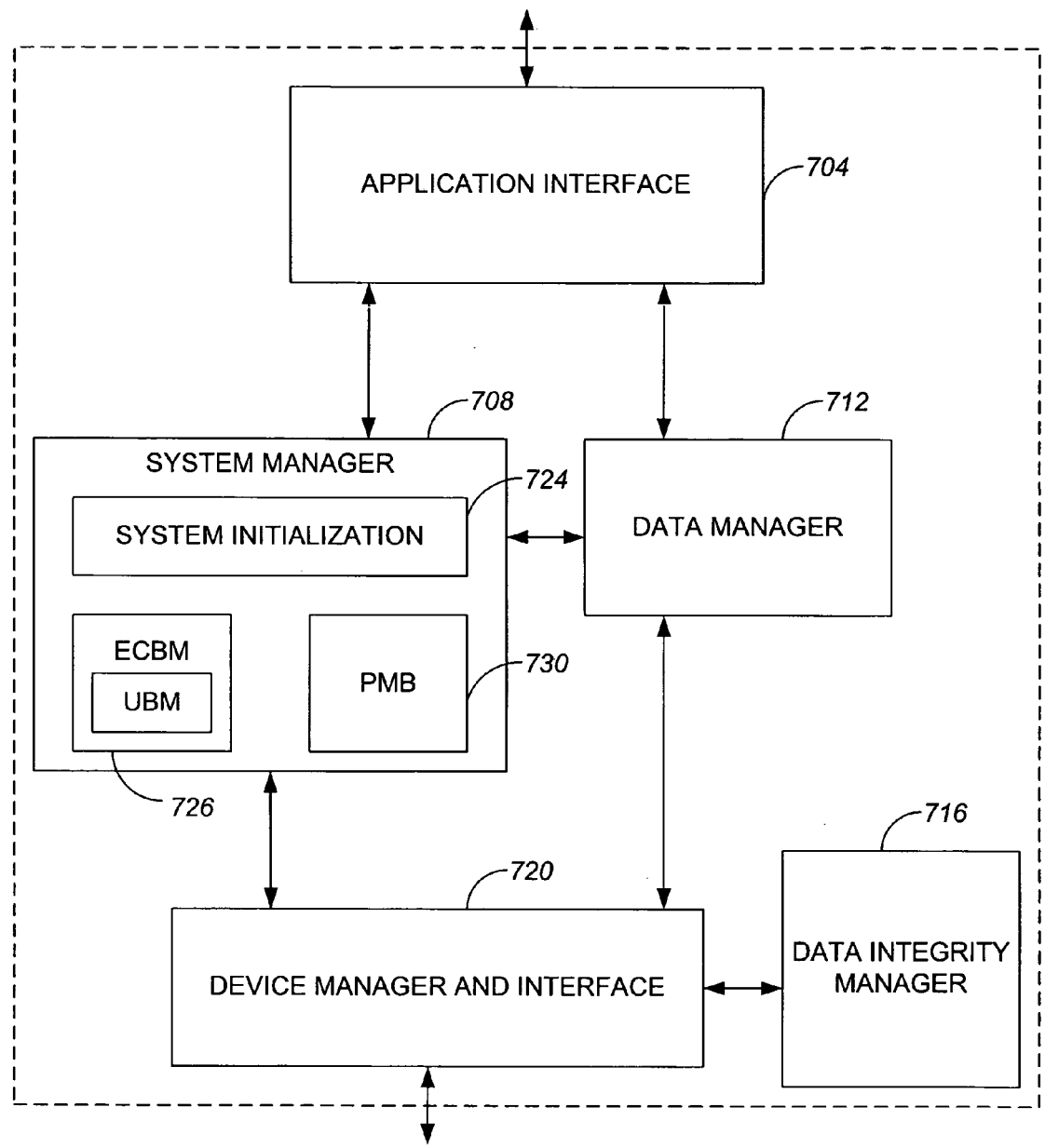
FIG. 7 is a diagrammatic block diagram representation of a system architecture in accordance with an embodiment of the present invention.

In general, the functionality associated with maintaining tables, handling initialization requests, and performing wear leveling, e.g., responding to requests to swap or update blocks, is provided in software, e.g., as program code devices, or as firmware to a host system. One embodiment of a suitable system architecture associated with the software or firmware provided to a host system to enable wear leveling to occur is shown in FIG. 7. A system architecture 700 generally includes a variety of modules which may include, but are not limited to, an application interface module 704, a system manager module 708, a data manager module 712, a data integrity manager 716, and a device manager and interface module 720. In general, system architecture 700 may be implemented using software code devices or firmware which may be accessed by a processor, e.g., processor 108 of FIG. 1a.

In general, application interface module 704 may be arranged to communicate with a flash memory (not shown) or, more generally, a media, to initialize the media during the course of an initialization request. Application interface module 704 may also read from, as well as write to, a sector, a cluster, or a page associated with the media. Typically, in addition to communicating with a media, application interface module 704 is also in communication with system manager module 708 and data manager module 712.

System manager module 708 includes a system initialization submodule 724, an erase count block management submodule 726, and a power management block submodule 730. System initialization submodule 724 is generally arranged to enable an initialization request to be processed, and typically communicates with erase count block management submodule 726. In one embodiment, system initialization submodule 724 allows erase counts of blocks to be updated, and is substantially responsible for creating a least frequently erased block table and a most frequently erased block table.

Erase count block management submodule 726 includes functionality to cause erase counts of blocks to be stored, as for example in erase count blocks, and functionality to cause an average erase count to be calculated, as well as updated, using individual erase counts. In other words, erase count block management submodule 726 effectively allows erase counts to be cataloged and allows an average erase count to be maintained. Further, in one embodiment, erase count block management submodule 726 also substantially synchronizes the erase count of substantially all blocks in erase count blocks during a initialization request of an overall system. While erase count block management submodule 726 may be arranged to cause an average erase count to be stored in erase count blocks, it should be appreciated that power management block submodule 730 may instead be used to enable the average erase count to be stored.

In addition to being in communication with application interface module 704, system manager module 708 is also in communication with data manager module 712, as well as device manager and interface module 720. Data manager module 712, which communicates with both system manager module 708 and application interface module 704, may include functionality to provide page or block mapping. Data manager module 712 may also include functionality associated with operating system and file system interface layers.

Device manager and interface module 720, which is in communication with system manager module 708, data manager 712, and data integrity manager 716, typically provides a flash memory interface, and includes functionality associated with hardware abstractions, e.g., an I/O interface. Data integrity manager module 716 provides ECC handling, among other functions.

Figure 8A:
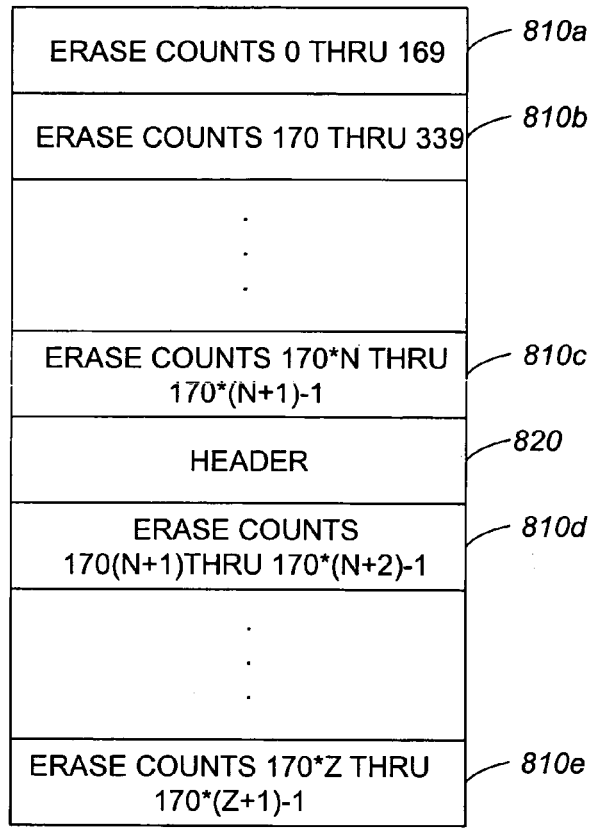
FIG. 8a is a diagrammatic representation of an erase count block in accordance with an embodiment of the present invention.

As described above, erase counts for each block in a non-volatile memory system may be stored in erase count blocks, which is a reserved block that is stored in a system or NAND memory associated with the non-volatile memory system. The erase count blocks may also contain an average erase count average erase count, in addition to the erase count of each block. FIG. 8a is a diagrammatic representation of erase count blocks in accordance with an embodiment of the present invention. An erase count block 800 is generally sized such that erase count block 800 includes a certain number of bits for each block, i.e., physical block, within the overall non-volatile system which includes erase count block 800. The number of bits effectively allocated to each block may be chosen such that the entire erase count for a block may be accommodated by the allocated bits. In one embodiment, erase count block 800 may include approximately three bytes for each block, as three bytes are generally sufficient to accommodate erase counts on the order of approximately one hundred thousand. When three bytes are allocated for each block, in a 512 Mb system that includes approximately 2048 blocks with 64 pages per block, erase count block 800 maybe sized to include approximately 12 pages, e.g., approximately six thousand bytes.

Erase count block 800 includes pages 810 which, as will be appreciated by those skilled in the art, often include approximately 512 bytes which may be used to store data such as erase counts. As shown, a first page 810a may be arranged to contain erase count entries for blocks '0' through '169,' while second page 810b may be arranged to contain erase count entries for blocks '170' through '339.' When an erase count for block '1,' i.e., physical block '1,' is to be written or read, bytes three through five of first page 810a may be accessed, as bytes three through five of first page 810a are arranged to contain an erase count entry which corresponds to block '1,' as will be described below with respect to FIGS. 8b and 8c.

Erase count block 800, in addition to including pages 810, also includes a header 820 which may generally be located substantially anywhere within erase count block 800. Header 820, which will be discussed below with reference to FIG. 9, may be a page in erase count block 800 which includes information relating to the non-volatile flash memory which includes the blocks associated with the erase counts stored in pages 810.

Figure 8B:
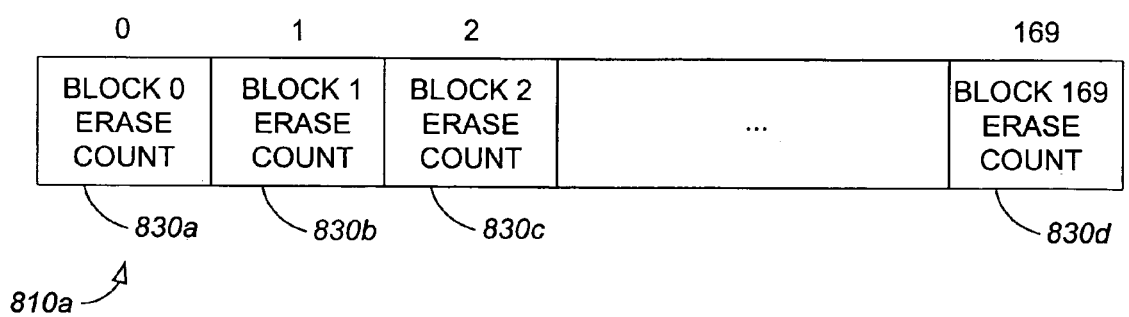
FIG. 8b is a diagrammatic representation of a page within an erase count block, e.g., page 810a of erase count block 800 of FIG. 8a, with the page divided substantially into locations in accordance with an embodiment of the present invention.

FIG. 8b is a diagrammatic representation of a page within an erase count block, e.g., page 810a of erase count block 800 of FIG. 8a, in accordance with an embodiment of the present invention. Page 810a is arranged to hold entries 830 which correspond to approximately one hundred and seventy physical blocks. As shown, entries 830 contain erase counts for blocks such that a first entry 830a in page 810a is arranged to contain an erase count for block '0,' and a second entry 830b is arranged to contain an erase count for block '1.' A final entry 830d in page 810a is arranged to hold an erase count for block '169.'

Figure 8C:
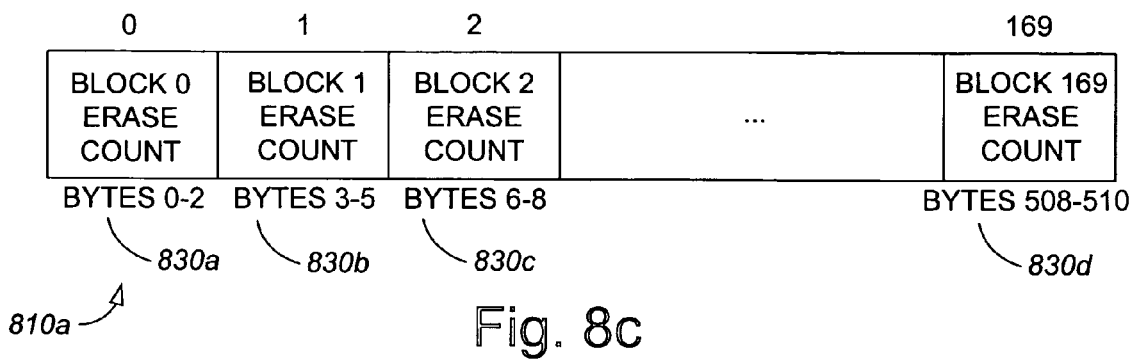
FIG. 8c is a diagrammatic representation of a page within an erase count block, e.g., page 810a of erase count block 800 of FIG. 8a, with the page substantially divided into bytes in accordance with an embodiment of the present invention.

Each entry 830 includes substantially the same number of bytes. As shown in FIG. 8c, entry 830a which corresponds to block '0' may be bytes zero through two in page 810a, while entry 830c which corresponds to block '2' may be bytes six through eight in page 810a. As previously mentioned, each entry 830 may include approximately three bytes, although it should be appreciated that the number of bytes in each entry 830 and, hence, the number of entries 830 in page 810a, may vary. By way of example, in one embodiment, each entry 830 may include approximately four bytes.

While each entry 830 in page 810a is arranged to contain an erase count, entries 830 may not necessarily contain an erase count. For instance, when a particular block is unusable and may not be written to or read from, e.g., due to a manufacturing or factory defect, that block will generally not have an erase count. As such, an erase count block such as erase count block 800 of FIG. 8a will generally not have an entry which contains an erase count for an unusable block. Instead, in lieu of holding erase counts, entries 830 for unusable blocks may hold indicators or markings which are arranged to identify blocks as being unusable.

Figure 8D:
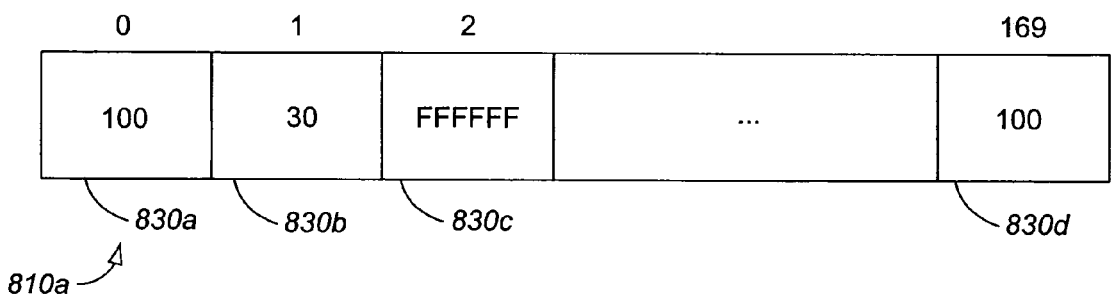
FIG. 8d is a diagrammatic representation of a page in an erase count block, e.g., page 810a of erase count block 800 of FIG. 8a, which contains erase counts and an entry which indicates that a particular block is unusable in accordance with an embodiment of the present invention.

FIG. 8d is a diagrammatic representation of a page in an erase count block, e.g., page 810a of erase count block 800 of FIG. 8a, which contains erase counts and an entry which indicates that a particular block is unusable in accordance with an embodiment of the present invention. When a block is usable, or may be written to or read from, the block will generally have an erase counts. For example, entry 830a of page 810a, which is arranged to contain an erase count that corresponds to block '0,' may contain a value of '100' when block '0' has been erased one hundred times. Similarly, entry 830b of page 810a may contain a value of '30' when block '1' has been erased thirty times.

If block '2' has been identified as being an unusable block, as for example through a marking stored within block '2,' then entry 830c of page 810a, which corresponds to block '2' may contain a marking which is arranged to indicate that block '2' is not usable. In one embodiment, a marking of 'FFFFFF' in entry 830c may indicate that block '2' is unusable due to a factory defect. It should be appreciated that substantially any marking may be used to indicate that a block is unusable.

Figure 9:
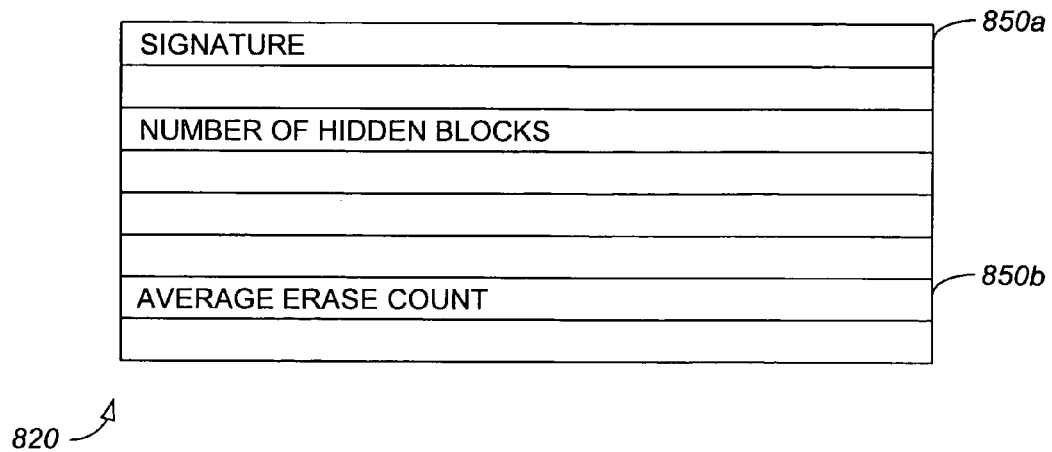
FIG. 9 is a diagrammatic representation of a header of an erase count block, e.g., header 820 of erase count block 800 of FIG. 8a, in accordance with an embodiment of the present invention.

As discussed above, an erase count block such as erase count block 800 of FIG. 8a typically includes a header 820 which, in one embodiment, is a page within erase count block 800 which contains information that generally relates to the blocks within a non-volatile memory system. Referring next to FIG. 9, a header of an erase count block, e.g., header 820 of erase count block 800 of FIG. 8a, will be described in accordance with an embodiment of the present invention. Header 820, which may be located substantially anywhere within an erase count block, may include approximately 512 bytes which may be used to store information. The information stored in header 820 includes a signature 850a and partitioning information 850b. Signature 850a may be used for security checks.

Although an average erase count may be stored substantially anywhere in a system memory of a non-volatile memory system, in the described embodiment, an average erase count is stored as information 850b in header 820.

Figure 10:
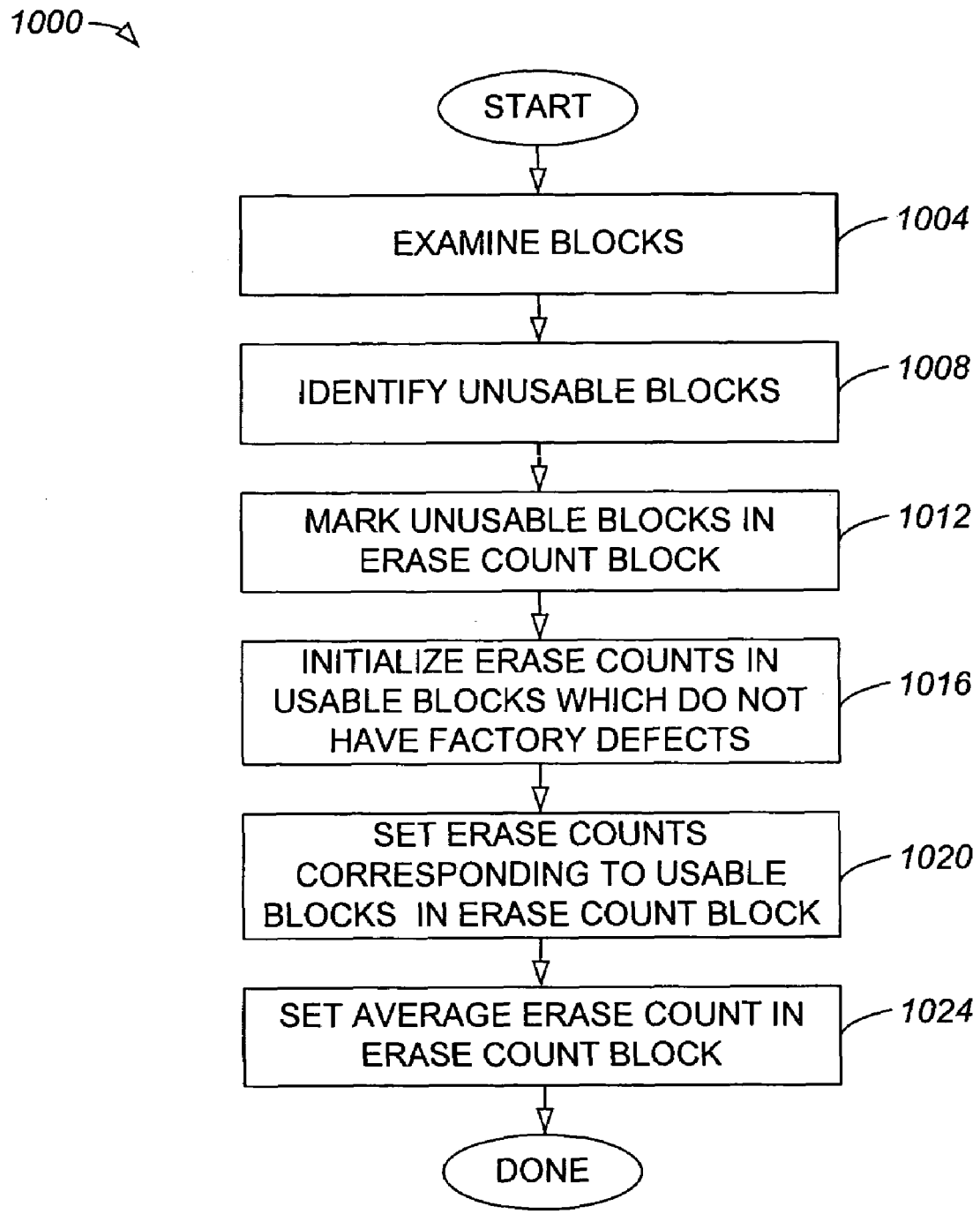
FIG. 10 is a process flow diagram which illustrates the steps associated with one method of initializing an erase count block when a non-volatile memory of a non-volatile memory system is first formatted in accordance with an embodiment of the present invention.

An erase count block is generally initialized, or otherwise created, when power is first provided to a non-volatile memory system which includes the erase count block. In other words, an erase count block is typically initialized when a non-volatile memory of a non-volatile memory system is first formatted. With reference to FIG. 10, the steps associated with one method of initializing an erase count block when a non-volatile memory of a non-volatile memory system is first formatted will be described in accordance with an embodiment of the present invention. A process 1000 begins at step 1004 in which all blocks or, more specifically, all physical blocks, within the non-volatile memory system are examined. Examining the blocks may include examining the contents of the blocks to determine which of the blocks maybe unusable, i.e., identified by a manufacturer of the non-volatile memory as being unusable. Accordingly, in step 1008, unusable blocks within the non-volatile memory are identified. Identifying the unusable blocks may involve identifying each block which contains a marking, e.g., a particular marking such as 'FFFFFF', which is known to identify the block as having or otherwise including a factory defect.

Once substantially all unusable blocks are identified, the unusable blocks are marked or otherwise identified in the erase count block as being unusable in step 1012. Marking a particular block as being unusable may include placing a particular marking or code in the portion of the erase count block that is reserved for the block that identifies the block as being unusable. It should be appreciated that marking unusable blocks in the erase count block typically also includes updating the header of the erase count block to include a count of the total number of unusable blocks within the non-volatile memory.

After the unusable blocks are marked in the erase count block, the erase counts of usable blocks, or blocks which do not have factory defects, which are not erased are initialized in step 1016. Initializing the erase counts may include setting the erase count of each block which is not erased to a value of zero. An erase count for a block is typically stored in at least one of the redundant or overhead areas associated with the block. The erase counts corresponding to the usable blocks, both erased and unerased usable blocks, may then be set in the erase count block in step 1020. Typically, an erase count stored in the erase count block may be set or otherwise initialized to a value of zero, or in the case of an unerased block, the same value as the erase count as stored in its corresponding unerased block. In other words, the erase count for an unerased block is generally the same as the erase count stored into the erase count block in a location which corresponds to the block. Once the erase counts are set as entries in the erase count block, then the average erase count may be set in step 1034 in the erase count block. As previously discussed, the average erase count may be stored into the header of the erase count block. When the erase counts of the usable blocks are all initialized to a value of zero, then the average erase count may initially be set to a value of zero. The process of formatting a non-volatile memory included in a non-volatile memory system is completed after the average erase count is set.

Figure 11:
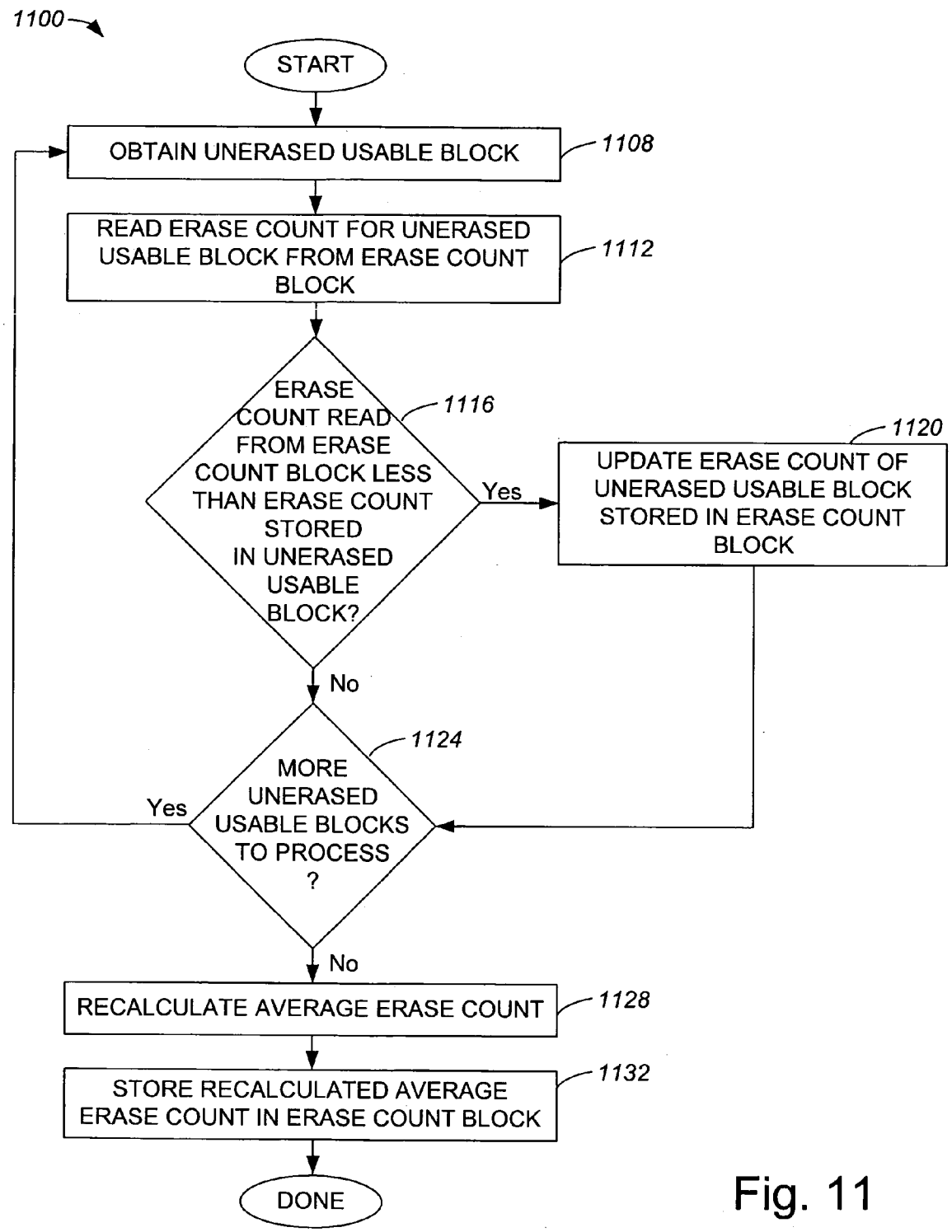
FIG. 11 is a process flow diagram which illustrates the steps associated with one method of updating an erase count block in response to an initialization request in accordance with an embodiment of the present invention.

Each time an initialization process is to be processed within a non-volatile memory system, entries in the erase count block may be updated. It should be appreciated, however, that the erase count block may generally be updated at substantially any time, e.g., in response to a command issued by a user. Referring next to FIG. 11, the steps associated with one method of updating an erase count block in response to an initialization request will be described in accordance with an embodiment of the present invention. A process 1100 of updating an erase count block begins at step 1108 in which an unerased usable block is obtained. As will be appreciated by those skilled in the art, an unerased usable block generally contains data, and is effectively in use. The erase count entry stored for the unerased usable block in the erase count block is obtained in step 1108. In other words, the entry in the erase count block which corresponds to the erase count of the unerased usable block is read. Once the entry for the erase count of the unerased usable block obtained in step 1108 is read, it is determined in step 1116 whether the erase count entry has a value that is less than the erase count stored in the unerased usable block.

If it is determined in step 1116 that the erase count entry stored in the erase count block for the unerased usable block is less than the erase count stored in the unerased usable block, then the indication is that the erase count entry stored in the erase count block is not current. Accordingly, process flow moves from step 1116 to step 1120 in which the erase count stored in the erase count block as an entry which corresponds to the unerased usable block is updated. Updating the erase count entry typically involves storing the current erase count of the unerased usable block into the erase count block. Once the erase count entry is updated, a determination is made in step 1124 regarding whether there are more unerased usable blocks to process.

When the determination in step 1124 is that there are more unerased usable blocks to process, then process flow returns to step 1108 in which another unerased usable block is obtained. Alternatively, when it is determined that substantially all unerased usable blocks have been processed, e.g. that the erase count entries for substantially all unerased usable blocks in the erase count block for have been updated, the average erase count of all usable blocks within the non-volatile memory is recalculated in step 1128. As will be appreciated by those skilled in the art, the average erase count may be determined by summing all erase counts stored in the erase count block, then dividing by the number of erase counts stored in the erase count block, as will be described below with respect to FIG. 13. After the average erase count is recalculated, the recalculated average erase count is stored in the erase count block in step 1132. As previously discussed, the average erase count may be stored in a header of the erase count block. Once the average erase count is stored, the process of updating the erase count block in response to an initialization request is completed.

Returning to step 1116, when it is determined that the erase count entry in an erase count block for an obtained unerased usable block is not less than the erase count stored in the obtained unerased usable block, then the implication is that the erase count entry in the erase count block is up-to-date. As such, process flow moves substantially directly from step 1116 to step 1124 in which it is determined whether there are more unerased usable blocks to process.

As previously discussed, an erase count for a block is stored in at least one of the redundant or overhead areas associated with the block. For example, an erase count for a block may be stored in at least the redundant area associated with a first page within the block. However, when a block is erased, substantially all contents of the block, including the erase count, are typically erased. Hence, when an erased block is obtained for use, i.e., when an erased block is obtained from a spare block pool such as a least frequently erased block table, the erased block will not include an erase count.

Figure 12:
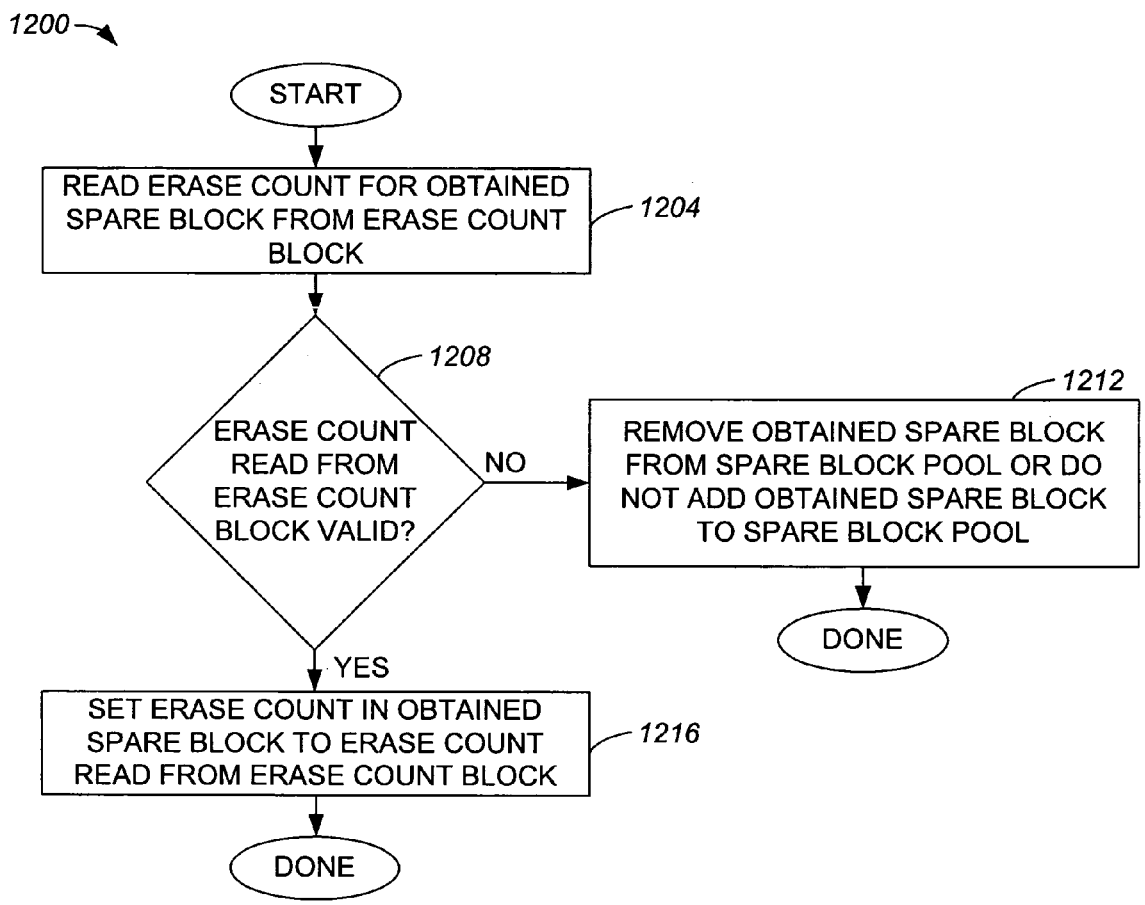
FIG. 12 is a process flow diagram which illustrates the steps associated with one method of obtaining an erase count for a spare block in accordance with an embodiment of the present invention.

Typically, an erase count for an erased block that has been obtained from a spare block pool for use, i.e., a spare block, may be read from an erase count block. FIG. 12 is a process flow diagram which illustrates the steps associated with one method of obtaining an erase count for a spare block in accordance with an embodiment of the present invention. A process of obtaining an erase count 1200 of a spare block begins at step 1204 in which the erase count entry for the obtained spare block is read from the erase count block. Specifically, the bits stored in the erase count block which correspond to an erase count for the spare block are read. A determination is then made in step 1208 regarding whether the bits in the erase count entry are valid. That is, it is determined whether the bits in the erase count entry for the spare block represent a previously stored erase count, or whether the bits in the erase count entry for the spare block represent something else, e.g., whether the bits identify the spare block as previously being unavailable due to a growing defect.

If it is determined in step 1208 that the erase count entry, or the erase count read from the erase count block, is effectively not a valid erase count, then process flow moves from step 1208 to step 1212 in which this erased block is either removed from the spare block pool, if the erased block was obtained from the spare block pool, or not added to the spare block pool, if the erased block was not obtained from the spare block pool.

Alternatively, if it is determined in step 1208 that the contents of the erase count entry in the erase count block for the spare block is valid for use as an erase count, then process flow proceeds from step 1208 to step 1216 in which the contents of the erase count entry are set as the erase count of the spare block. In other words, if the erase count read from the erase count block for the spare block is a valid erase count, then the erase count read from the erase count block is set as the actual erase count of the spare block. After the erase count of the spare block is set to the erase count read from the erase count block, the process of obtaining an erase count for the spare block is completed.

Figure 13:
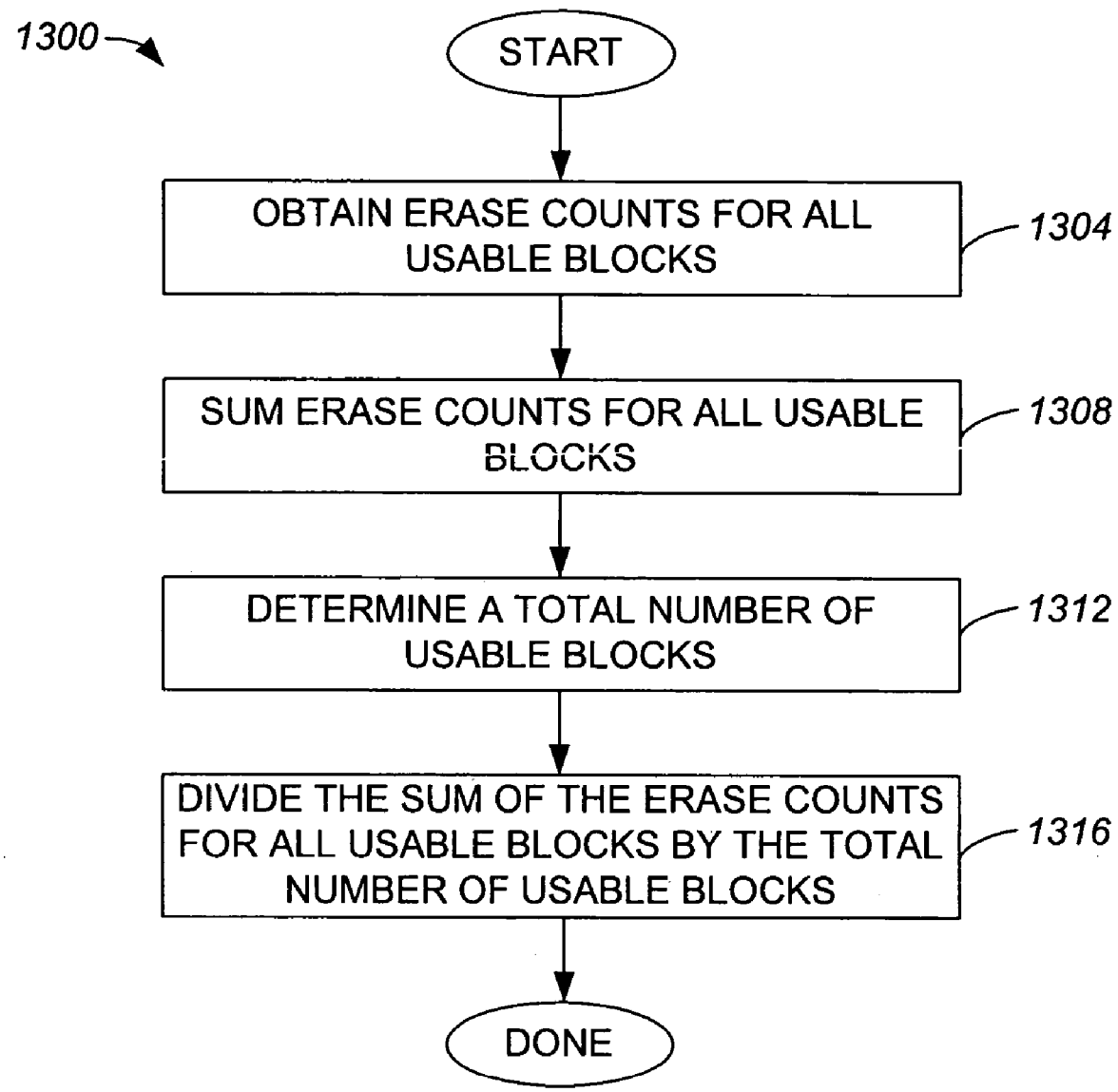
FIG. 13 is a process flow diagram which illustrates one method of calculating an average erase count in accordance with an embodiment of the present invention.

In general, the steps associated with calculating or recalculating an average erase count may be widely varied. FIG. 13 is a process flow diagram which illustrates one method of calculating an average erase count in accordance with an embodiment of the present invention. A process 1300 of calculating an average erase count begins at step 1304 in which the erase counts for all usable blocks are obtained. As usable blocks which are in unerased and usable blocks which are erased have associated erase counts, while unusable blocks generally either do not have erase counts or do not have obtainable erase counts, substantially only the erase counts of the usable blocks are obtained. The erase counts are typically obtained from an erase count block, although it should be appreciated that the erase counts for unerased usable blocks may instead be obtained from the redundant areas of the unerased usable blocks.

Once the erase counts for usable blocks are obtained, the erase counts for the usable blocks are summed in step 1308. That is, the erase counts for the usable blocks are added together. Then, in step 1312, a total number of usable blocks is determined in step 1312. The total number of usable blocks may be determined by obtaining a total number of blocks and a total number of unusable blocks from the erase count block, then subtracting the total number of unusable blocks from the total number of blocks. Alternatively, the total number of usable blocks may be obtained by effectively cycling through the all blocks and maintaining a running count of all usable blocks.

After the total number of usable blocks is obtained, the sum of the erase counts for all the usable blocks is divided by the total number of usable blocks in step 1316 to generate an average erase count. Once the total number of usable blocks is divided into the sum of the erase counts, the process of generating an average erase count is completed.

Although only a few embodiments of the present invention have been described, it should be understood that the present invention may be embodied in many other specific forms without departing from the spirit or the scope of the present invention. By way of example, the size of an erase count block and the location of a header within the erase count block may vary widely. In addition, the contents of the header of an erase count block may also vary depending upon the requirements of a particular system.

While non-volatile memory systems have been described as being controlled by associated memory controllers or being controlled using software or firmware associated with a host system, it should be understood that wear leveling processes which include erase count management may be applied to non-volatile memory systems which are in communication with controllers which are substantially external to the non-volatile memory systems. Suitable memory systems which use controllers include, but are not limited to, PC cards, CompactFlash cards, MultiMedia cards, Secure Digital cards, and embedded chip sets which include flash memory and a flash memory controller. Memory systems which are controlled through the use of software or firmware loaded onto a host system include embedded memory devices. In one embodiment, memory systems which may use the erase management techniques and erase count block management techniques described above and do not use controllers associated with the memory systems may use controllers associated with a host, e.g., a host computer system, to implement wear leveling. That is, a host may directly address and manage memory in which wear leveling is to occur through the use of a controller on the host.

An erase count block has generally been described as being a block which includes a number of pages. It should be appreciated, however, that substantially any suitable data structure in a system memory may be arranged to hold erase counts and an average erase count.

In one embodiment, an erase count block may include substantially only entries which correspond to erase counts of blocks within a non-volatile memory system. In such an embodiment, information which is generally contained in a header of an erase count may be stored in a data structure or a block that is separate from the erase count block. That is, information such as an average erase count may not necessarily be stored in an erase count block or, more specifically, a header of the erase count block, when an erase count block is arranged substantially only to contain entries pertaining to erase counts associated with blocks. Alternatively, in lieu of being stored in a header of an erase count block, an average erase count may instead be stored substantially anywhere within an erase count block.

An average erase count has been described as being determined by summing the erase counts of all usable blocks, then dividing the sum of the erase counts of the usable blocks by a total number of usable blocks. It should be appreciated that in lieu of dividing the sum by the total number of usable blocks, the sum may instead be divided by the total number of blocks. In addition, the average erase count may be determined, in one embodiment, by effectively summing together erase counts for all blocks by using a current average erase count to represent the erase count of each unusable block such that each block is essentially accounted for in an average erase count. The sum of all erase counts, including actual erase counts for usable blocks and current average erase counts for each unusable block, may then be divided by the total number of blocks to generate a new or updated average erase count.

In lieu of calculating an average erase count that effectively reflects an average number of times each block of a total number of blocks has been erased, other characterizations of a number of times each block has been erased may instead be calculated. For instance, a median number of times each block of a total number of blocks, e.g., usable blocks, has been erased may be determined.

While the use of an erase count block to maintain the erase counts of blocks within a memory system has been described, it should be understood that the erase count block may instead be used to maintain the erase counts of substantially any memory elements which may be erased. By way of example, in one embodiment, an erase count block or data structure may maintain erase counts for pages rather than blocks.

Generally, the steps associated with the various processes and methods of wear leveling may vary widely. Steps may generally be added, removed, altered, and reordered without departing from the spirit of the scope of the present invention. Therefore, the present examples are to be considered as illustrative and not restrictive, and the invention is not to be limited to the details given herein, but may be modified within the scope of the appended claims.

What is claimed is:

1. A method of managing a non-volatile memory of a memory system according to an average number of times each block of a number of blocks within the non-volatile memory has been erased, the method comprising:
   for a first block of the number of blocks, comparing an erase count stored in the first block, the erase count indicating a number of times that block has been erased, with an erase count value for the first block stored in a non-volatile portion of a system memory of the memory system;
   responsive to the comparing step determining that the erase count stored in the first block is greater than the erase count value for the first block stored in the system memory, updating the erase count value for the first block stored in system memory to correspond to the erase count stored in the first block;
   also responsive to the comparing step determining that the erase count stored in the first block is greater than the erase count value, obtaining an erase count-for each block of the number of blocks, wherein the number of blocks is a total number of usable blocks within the non-volatile memory;
   creating a sum of the obtained erase counts for the number of blocks;
   creating an average erase count, from the sum of the obtained erase counts; and
   storing an indicator of the average erase count in a non-volatile portion of the system memory of the memory system.

2. The method of claim 1 wherein the non-volatile memory is a NAND flash memory.

3. The method of claim 1, wherein the step of obtaining an erase count for each block of the number of blocks comprises:
   for each block of the number of blocks, obtaining an erase count stored in that block;
   and further comprising:
   after the step of obtaining an erase count for each block of the number of blocks, updating the erase count value for each of the number of blocks stored in system memory to correspond to the obtained erase count for that block.

4. The method of claim 3, wherein the step of creating the average erase count comprises:
   dividing the sum of the obtained erase counts by the number of blocks.

5. A non-volatile memory system comprising:
   a non-volatile memory, the non-volatile memory including a number of blocks, each block including a redundant area for storing overhead data comprising an erase count for that block;
   a system memory, associated with the non-volatile memory, and having a non-volatile portion including an erase count block; and
   means for managing the erase count block by performing a sequence of operations comprising:
      comparing an erase count stored in the redundant area of a first block of the number of blocks, with an erase count value associated with the first block that is stored in the erase count block, the erase count arranged to indicate a number of times the block has been erased;
      updating the erase count value in the erase count block for the first block, to correspond to the erase count stored in the first block, responsive to the comparing means determining that the erase count stored in the first block is greater than the erase count value stored in the erase count block for the first block;
      obtaining an erase count for each block of the number of blocks from the redundant area of each block, responsive to the comparing means determining that the erase count stored in the redundant area of the first block is less than the erase count value for that block stored in the erase count block;
      creating an average erase count, indicating an average number of times each block of the number of blocks has been erased; and
      storing a first indicator corresponding to the average erase count in the non-volatile portion of the system memory.

6. The non-volatile memory system of claim 5, wherein the operation of creating an average erase count comprises the operations of:
   creating a sum of the obtained erase counts for the number of blocks;
   dividing the sum by the number of blocks.

7. The non-volatile memory system of claim 5, wherein the managing means comprises:
   an erase count block management software submodule; and
   a microprocessor for executing the erase count block management software submodule.

8. The non-volatile memory system of claim 7, wherein the erase count block management software submodule comprises:
   code devices that obtain an erase count for each block of the plurality of blocks, the erase count for each block of the plurality of blocks being arranged to indicate a number of times each block of the plurality of blocks has been erased, wherein the plurality of blocks correspond to usable blocks within the non-volatile memory;
   code devices that create a sum of the erase counts for the plurality of blocks;
   code devices that create the average erase count, the average erase count being arranged to indicate the average number of times each memory element of the plurality of blocks has been erased, wherein the code devices that create the average erase count include code devices that divide the sum by the number of blocks in the plurality of blocks; and
   a memory area that stores the code devices.

9. The memory system of claim 8 wherein the non-volatile memory is a NAND flash memory.

* * * * *

UNITED STATES PATENT AND TRADEMARK OFFICE
CERTIFICATE OF CORRECTION

PATENT NO. : 7,287,118 B2
APPLICATION NO. : 11/362666
DATED : October 23, 2007
INVENTOR(S) : Robert C. Chang et al.

It is certified that error appears in the above-identified patent and that said Letters Patent is hereby corrected as shown below:

In column 26, claim 5, line 21, immediately after "erase count" delete ",".

Signed and Sealed this

Twenty-fourth Day of November, 2009

David J. Kappos
*Director of the United States Patent and Trademark Office*